US011710696B2

(12) United States Patent
Chiu et al.

(10) Patent No.: US 11,710,696 B2
(45) Date of Patent: Jul. 25, 2023

(54) SEMICONDUCTOR DEVICE WITH PROGRAMMABLE UNIT AND METHOD FOR FABRICATING THE SAME

(71) Applicant: NANYA TECHNOLOGY CORPORATION, New Taipei (TW)

(72) Inventors: Hsih-Yang Chiu, Taoyuan (TW); Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/678,232

(22) Filed: Feb. 23, 2022

(65) Prior Publication Data

US 2022/0223521 A1 Jul. 14, 2022

Related U.S. Application Data

(62) Division of application No. 17/149,032, filed on Jan. 14, 2021, now Pat. No. 11,469,175.

(51) Int. Cl.
*H01L 23/00* (2006.01)
*H01L 23/525* (2006.01)
(Continued)

(52) U.S. Cl.
CPC .... *H01L 23/5252* (2013.01); *H01L 21/28158* (2013.01); *H01L 21/3215* (2013.01);
(Continued)

(58) Field of Classification Search
CPC .............. H01L 23/535; H01L 23/5252; H01L 23/5256
See application file for complete search history.

(56) References Cited

U.S. PATENT DOCUMENTS 9,589,970 B1 3/2017 Tseng et al.
2013/0037865 A1* 2/2013 Nogami .......... H01L 21/823842
257/288
(Continued)

FOREIGN PATENT DOCUMENTS

CN 107749398 A * 3/2018

OTHER PUBLICATIONS

Office Action dated Jun. 16, 2022 related to Taiwanese Application No. 110132846.
(Continued)

*Primary Examiner* — Reema Patel
(74) *Attorney, Agent, or Firm* — Xuan Zhang

(57) ABSTRACT

The present application discloses a semiconductor device with a programmable unit and a method for fabricating the semiconductor device. The semiconductor device including a substrate, a bottom conductive layer positioned in the substrate, a first gate structure including a first gate dielectric layer positioned on the bottom conductive layer, a first work function layer positioned on the first gate dielectric layer, and a first filler layer positioned on the first work function layer, a second gate structure including a second gate dielectric layer positioned on the bottom conductive layer and spaced apart from the first gate dielectric layer, a second work function layer positioned on the second gate dielectric layer, and a second filler layer positioned on the second work function layer, a conductive plug electrically coupled to the bottom conductive layer, and a top conductive layer electrically coupled to the first gate structure and the second gate structure.

8 Claims, 30 Drawing Sheets

(51) Int. Cl.
*H01L 23/535* (2006.01)
*H01L 21/3215* (2006.01)
*H01L 29/92* (2006.01)
*H01L 21/28* (2006.01)
*H01L 29/40* (2006.01)
H01L 23/532 (2006.01)
H01L 29/49 (2006.01)

(52) U.S. Cl.
CPC .......... *H01L 23/535* (2013.01); *H01L 29/401* (2013.01); *H01L 29/92* (2013.01); *H01L 23/53271* (2013.01); *H01L 29/495* (2013.01)

(56) References Cited

U.S. PATENT DOCUMENTS

| | | | |
|---|---|---|---|
| 2013/0043539 A1 | 2/2013 | Chang et al. | |
| 2013/0200467 A1* | 8/2013 | Edge | H01L 21/823842 257/E27.06 |
| 2017/0005103 A1 | 1/2017 | Zhang et al. | |
| 2018/0315661 A1* | 11/2018 | Chuang | H01L 27/0886 |

OTHER PUBLICATIONS

Summary translation of Office Action dated Jun. 16, 2022 related to Taiwanese Application No. 110132846.

Office Action dated Apr. 14, 2022 related to U.S. Appl. No. 17/149,032, wherein this application is a Div of U.S. Appl. No. 17/149,032.

\* cited by examiner

SEMICONDUCTOR DEVICE WITH PROGRAMMABLE UNIT AND METHOD FOR FABRICATING THE SAME

CROSS-REFERENCE TO RELATED APPLICATION

This application is a divisional application of U.S. Non-Provisional application Ser. No. 17/149,032 filed Jan. 14, 2021, which is incorporated herein by reference in its entirety.

TECHNICAL FIELD

The present disclosure relates to a semiconductor device and a method for fabricating the semiconductor device, and more particularly, to a semiconductor device with a programmable unit and a method for fabricating the semiconductor device with the programmable unit.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a bottom conductive layer positioned in the substrate, an insulation layer positioned on the substrate, a first conductive layer positioned on the insulation layer and above the bottom conductive layer, a second conductive layer positioned on the insulation layer and above the bottom conductive layer and spaced apart from the first conductive layer, a conductive plug electrically coupled to the bottom conductive layer, and a top conductive layer electrically coupled to the first conductive layer and the second conductive layer. The first conductive layer has a first work function and the second conductive layer has a second work function different from the first work function. The bottom conductive layer, the insulation layer, the first conductive layer, and the second conductive layer together configure a programmable unit.

In some embodiments, the first conductive layer and the second conductive layer are formed of doped polycrystalline silicon, doped polycrystalline silicon germanium, or a combination thereof, and the first conductive layer and the second conductive layer have a same electrical type.

In some embodiments, the bottom conductive layer is formed of doped silicon, doped germanium, doped silicon germanium, or a combination thereof, and the bottom conductive layer has a same electrical type as the first conductive layer and the second conductive layer.

In some embodiments, the semiconductor device includes a well region positioned in the substrate and surrounding the bottom conductive layer. The well region has an electrical type opposite to that of the bottom conductive layer.

In some embodiments, the semiconductor device includes assistance layers covering the first conductive layer and the second conductive layer. The assistance layers are formed of titanium silicide, nickel silicide, nickel platinum silicide, tantalum silicide, or cobalt silicide.

In some embodiments, the semiconductor device includes spacers positioned on sidewalls of the first conductive layer and sidewalls of the second conductive layer.

In some embodiments, the bottom conductive layer is formed of tungsten, aluminum, titanium, copper, or a combination thereof.

In some embodiments, the first conductive layer and the second conductive layer are formed of different materials, the first conductive layer is formed of tungsten, cobalt, zirconium, tantalum, titanium, aluminum, ruthenium, copper, platinum, or a combination thereof, and the second conductive layer is formed of tungsten, cobalt, zirconium, tantalum, titanium, aluminum, ruthenium, copper, platinum, or a combination thereof.

Another aspect of the present disclosure provides a semiconductor device including a substrate, a bottom conductive layer positioned in the substrate, a first gate structure including a first gate dielectric layer positioned on the bottom conductive layer, a first work function layer positioned on the first gate dielectric layer, and a first filler layer positioned on the first work function layer, a second gate structure including a second gate dielectric layer positioned on the bottom conductive layer and spaced apart from the first gate dielectric layer, a second work function layer positioned on the second gate dielectric layer, and a second filler layer positioned on the second work function layer, a conductive plug electrically coupled to the bottom conductive layer, and a top conductive layer electrically coupled to the first gate structure and the second gate structure. The first work function layer has a first work function. The second work function layer has a second work function different from the first work function. The bottom conductive layer, the insulation layer, the first gate structure, and the second gate structure together configure a programmable unit.

In some embodiments, the first gate dielectric layer and the second gate dielectric layer have a same thickness.

In some embodiments, the semiconductor device includes spacers positioned on two sides of the first gate structure and on two sides of the second gate structure.

In some embodiments, the semiconductor device includes a first wetting layer positioned between the first work function layer and the first filler layer. The first wetting layer is formed of titanium, tantalum, nickel, or cobalt.

In some embodiments, the semiconductor device includes a first barrier layer positioned between the first wetting layer and the first filler layer. The first barrier layer is formed of titanium nitride, tantalum nitride, or a combination thereof.

In some embodiments, the first gate dielectric layer and the second gate dielectric layer have U-shaped cross-sectional profiles.

In some embodiments, the bottom conductive layer is formed of doped silicon, doped germanium, doped silicon germanium, or a combination thereof.

In some embodiments, the bottom conductive layer is formed of tungsten, aluminum, titanium, copper, or a combination thereof.

Another aspect of the present disclosure provides a semiconductor device including a substrate, a bottom conductive layer positioned in the substrate, an insulation layer positioned on the substrate, a first gate structure positioned on the insulation layer and above the bottom conductive layer and including a first work function layer and a first filler layer, a second gate structure positioned on the insulation layer and above the bottom conductive layer, spaced apart from the first gate structure, and including a second work function layer and a second filler layer, a conductive plug electrically coupled to the bottom conductive layer, and a top conductive layer electrically coupled to the first gate structure and the second gate structure. The first work function layer has a first work function. The second work function layer has a second work function different from the first work function. The bottom conductive layer, the insulation layer, the first gate structure, and the second gate structure together configure a programmable unit.

Another aspect of the present disclosure provides a method for fabricating a semiconductor device including providing a substrate, forming a bottom conductive layer in the substrate, forming an insulation layer on the substrate, forming a first conductive layer on the insulation layer and above the bottom conductive layer, and having a first work function, forming a second conductive layer on the insulation layer and above the bottom conductive layer, spaced apart from the first conductive layer, and having a second work function different from the first work function. The bottom conductive layer, the insulation layer, the first conductive layer, and the second conductive layer together configure a programmable unit.

In some embodiments, the steps of forming the first conductive layer and forming the second conductive layer include forming a first intermediate conductive layer and a second intermediate conductive layer on the insulation layer, forming a first mask layer to cover the second intermediate conductive layer and expose the first intermediate conductive layer, performing a first implantation process to turn the first intermediate conductive layer into the first conductive layer, removing the first mask layer, forming a second mask layer to cover the first conductive layer and expose the second intermediate conductive layer, performing a second implantation process to turn the second intermediate conductive layer into the second conductive layer, and removing the second mask layer. The first implantation process and the second implantation process are performed with different dopant concentrations.

In some embodiments, the bottom conductive layer, the first conductive layer, and the second conductive layer have a same electrical type.

Due to the design of the semiconductor device of the present disclosure, the resistance of the programmable unit after a programming procedure can be fine-tuned by controlling the programming voltage applied. In addition, various of programming voltages can be selected and applied to program the programmable unit.

Furthermore, the programmable unit can be programmed by a relatively smaller (or shallower) voltage. As a result, more surface area can be provided for other functional elements such as logic function elements.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
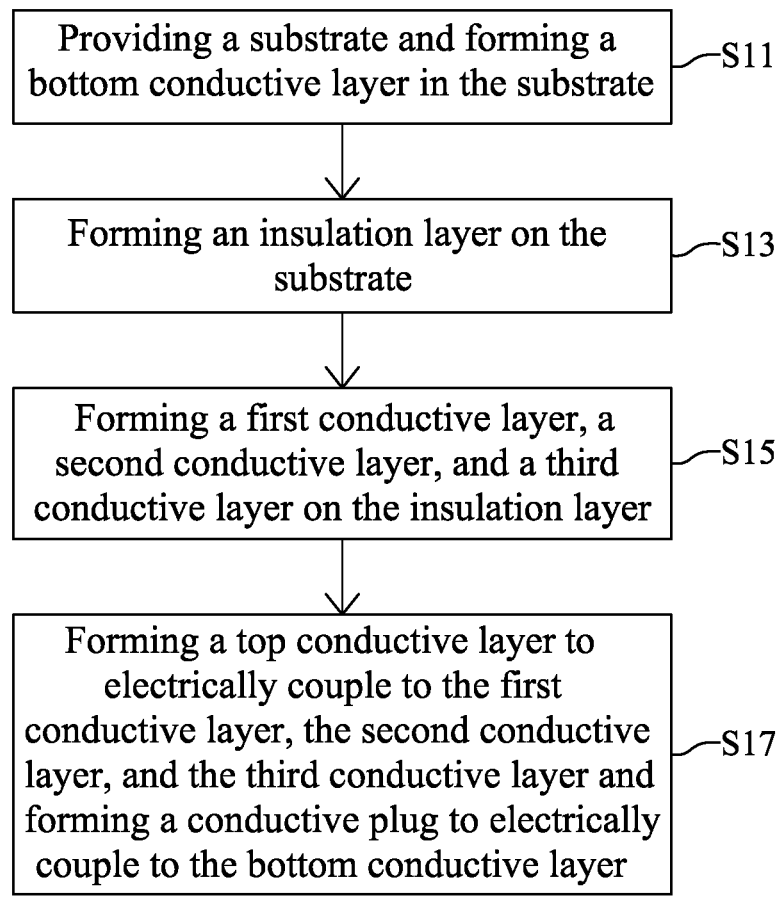
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

FIG. 1 illustrates, in a flowchart diagram form, a method 10 for fabricating a semiconductor device 1A in accordance with one embodiment of the present disclosure. FIGS. 2 to 8 illustrate, in schematic cross-sectional view diagrams, a flow for fabricating the semiconductor device 1A in accordance with one embodiment of the present disclosure.

Figure 2:
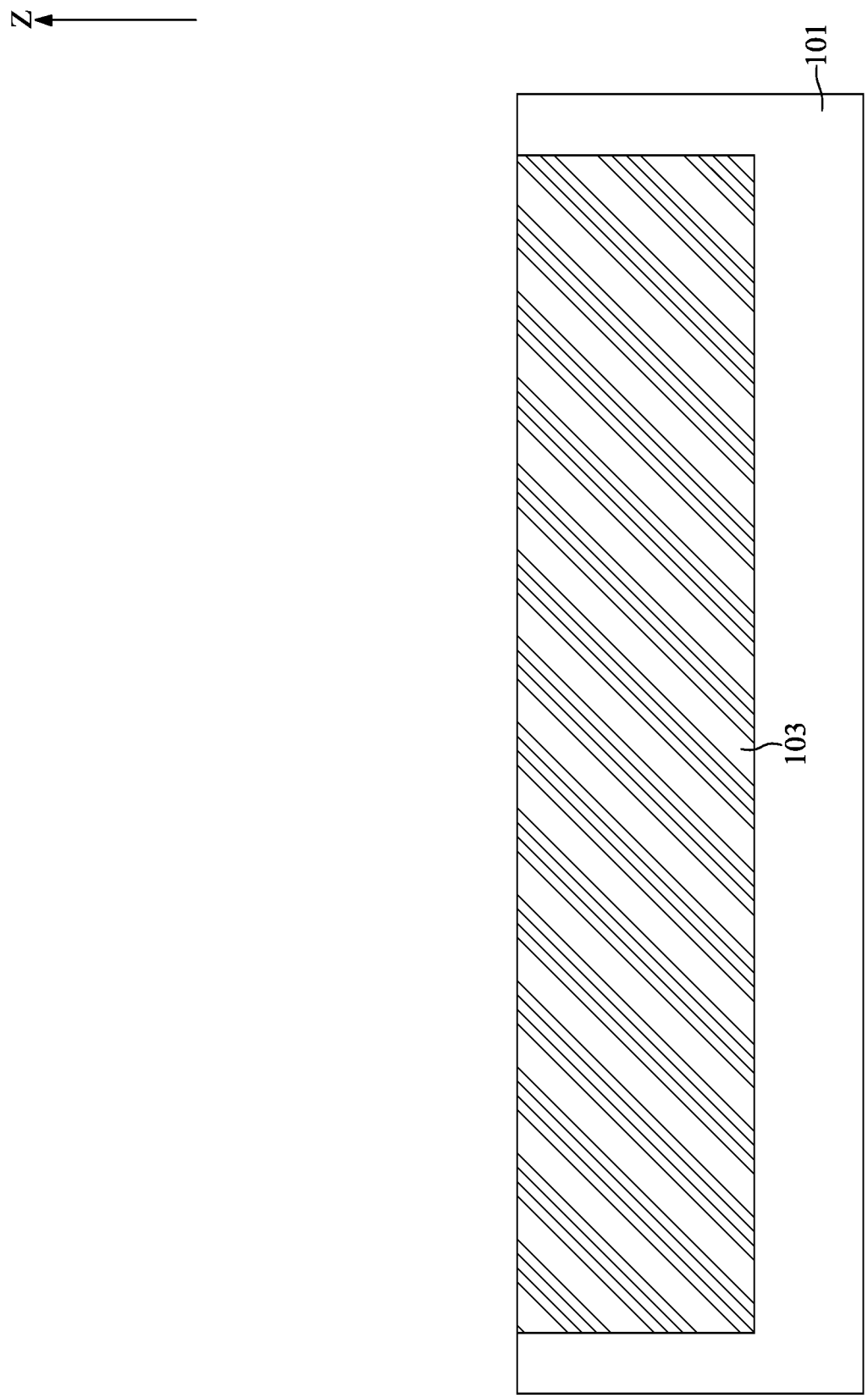
FIGS. 2 to 8 illustrate, in schematic cross-sectional view diagrams, a flow for fabricating the semiconductor device in accordance with one embodiment of the present disclosure.

With reference to FIGS. 1 and 2, at step S11, a substrate 101 may be provided and a bottom conductive layer 103 may be formed in the substrate 101.

With reference to FIG. 2, the substrate 101 may be a bulk semiconductor substrate, a multi-layered or gradient substrate, or the like. The substrate 101 may include a semiconductor material, such as an elemental semiconductor including silicon and germanium; a compound or alloy semiconductor including silicon carbide, silicon germanium, gallium arsenide, gallium phosphide, gallium arsenide phosphide, aluminum indium arsenide, aluminum gallium arsenide, gallium indium arsenide, indium arsenide, gallium indium phosphide, indium phosphide, indium antimonide, or gallium indium arsenide phosphide; or a combination thereof. The substrate 101 may be doped or undoped.

With reference to FIG. 2, the bottom conductive layer 103 may be formed in the substrate 101 and the top surface of the bottom conductive layer 103 may be substantially coplanar with the top surface of the substrate 101. In some embodiments, the bottom conductive layer 103 may define an operation area of a programmable unit.

In some embodiments, the bottom conductive layer 103 may be formed by an implantation process. That is, the bottom conductive layer 103 may be turned from a portion of the substrate 101. The dopants of the implantation process may include p-type impurities (dopants) or n-type impurities (dopants). The p-type impurities may be added to an intrinsic semiconductor to create deficiencies of valence electrons. In a silicon-containing substrate, examples of p-type dopants, i.e., impurities include but are not limited to boron, aluminum, gallium, and indium. The n-type impurities may be added to an intrinsic semiconductor to contribute free electrons to the intrinsic semiconductor. In a silicon-containing substrate, examples of n-type dopants, i.e., impurities, include but are not limited to antimony, arsenic, and phosphorous. In some embodiments, the dopant concentration of the bottom conductive layer 103 may be between about 1E19 atoms/cm^3 and about 1E21 atoms/cm^3. After the implantation process, the bottom conductive layer 103 may have an electrical type such as n-type or p-type.

In some embodiments, an anneal process may be performed to activate the bottom conductive layer 103. The temperature of the anneal process may be between about 800° C. and about 1250° C. The anneal process may have a process duration between about 1 millisecond and about 500 milliseconds. The anneal process may be, for example, a rapid thermal anneal, a laser spike anneal, or a flash lamp anneal.

Figure 3:
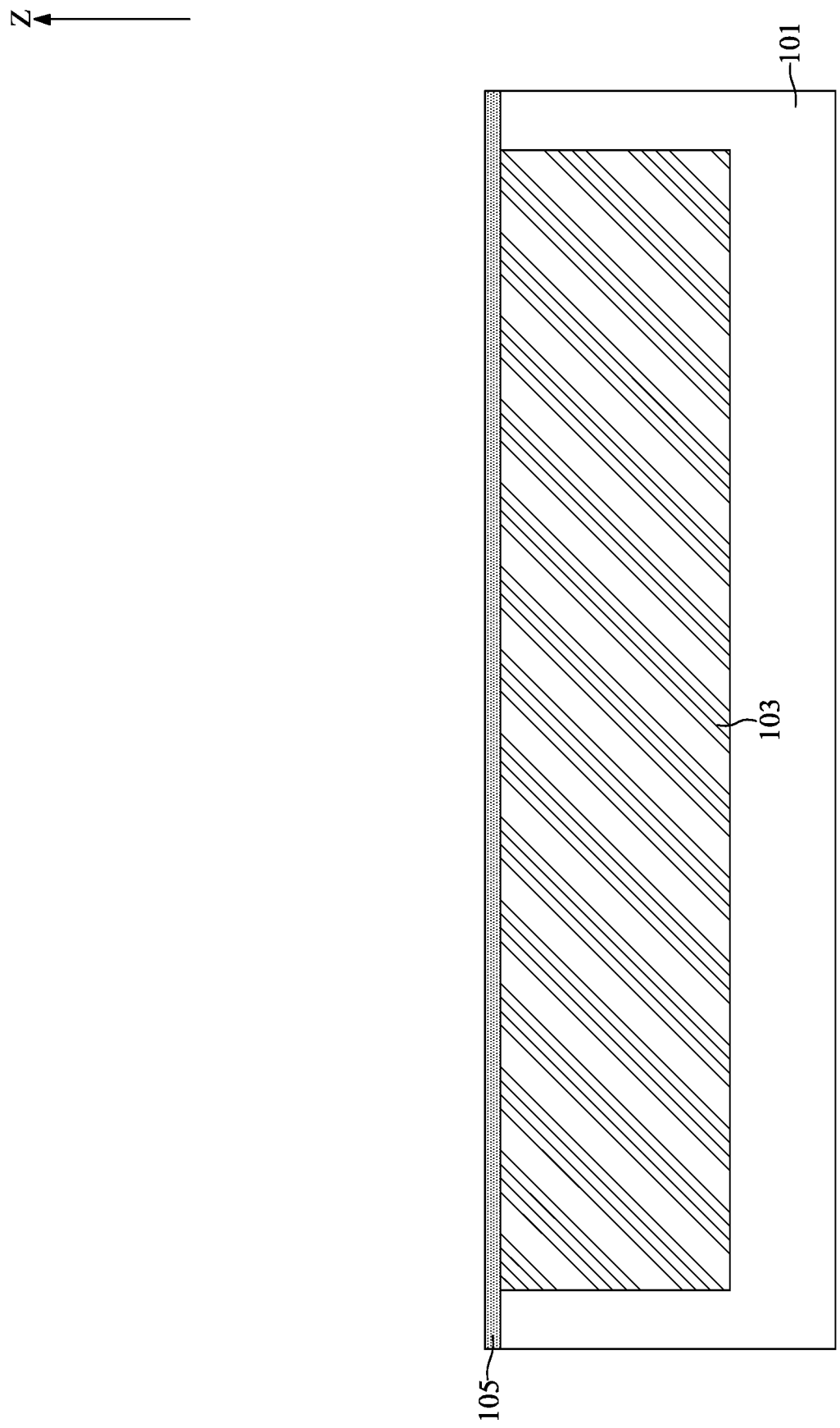

With reference to FIGS. 1 and 3, at step S13, an insulation layer 105 may be formed on the substrate 101.

With reference to FIG. 3, the insulation layer 105 may be formed on the substrate 101 and may cover the bottom conductive layer 103. The insulation layer 105 may include, for example, oxides, nitrides, oxynitrides, silicates (e.g., metal silicates), aluminates, titanates, nitrides, high-k dielectric materials, or a combination thereof. The insulation layer 105 may be formed by suitable deposition processes, for example, chemical vapor deposition, plasma-enhanced chemical vapor deposition, atomic layer deposition, evaporation, chemical solution deposition, or other suitable deposition processes. The thickness of the insulation layer 105 may vary depending on the deposition process as well as the composition and number of materials used. For example, the thickness of the insulation layer 105 may be between about 10 angstroms and about 50 angstroms. In some embodiments, the insulation layer 105 may include multiple layers. For example, the insulation layer 105 may be an oxide-nitride-oxide (ONO) structure. For another example, the insulation layer 105 may include a bottom layer formed of silicon oxide and a top layer formed of high-k dielectric materials.

Examples of high-k dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric materials may further include dopants such as, for example, lanthanum and aluminum.

In some embodiments, an interfacial layer (not shown) may be formed between the substrate 101 and the insulation layer 105. The interfacial layer may include be formed of, for example, silicon oxide, silicon nitride, silicon oxynitride, other semiconductor oxides, or a combination thereof. The interfacial layer may be formed to any suitable thickness using any suitable process including thermal growth, atomic layer deposition, chemical vapor deposition, high-density plasma chemical vapor deposition, spin-on deposition, or other suitable deposition processes. For example, the thickness of the interfacial layer may be between about 7 angstroms and 12 angstroms or between about 8 angstroms and 10 angstroms. The interfacial layer may facilitate the formation of the insulation layer 105 during fabrication of the semiconductor device 1A.

With reference to FIG. 1 and FIGS. 4 to 7, at step S15, a first conductive layer 201, a second conductive layer 301, and a third conductive layer 401 may be formed on the insulation layer 105.

Figure 4:
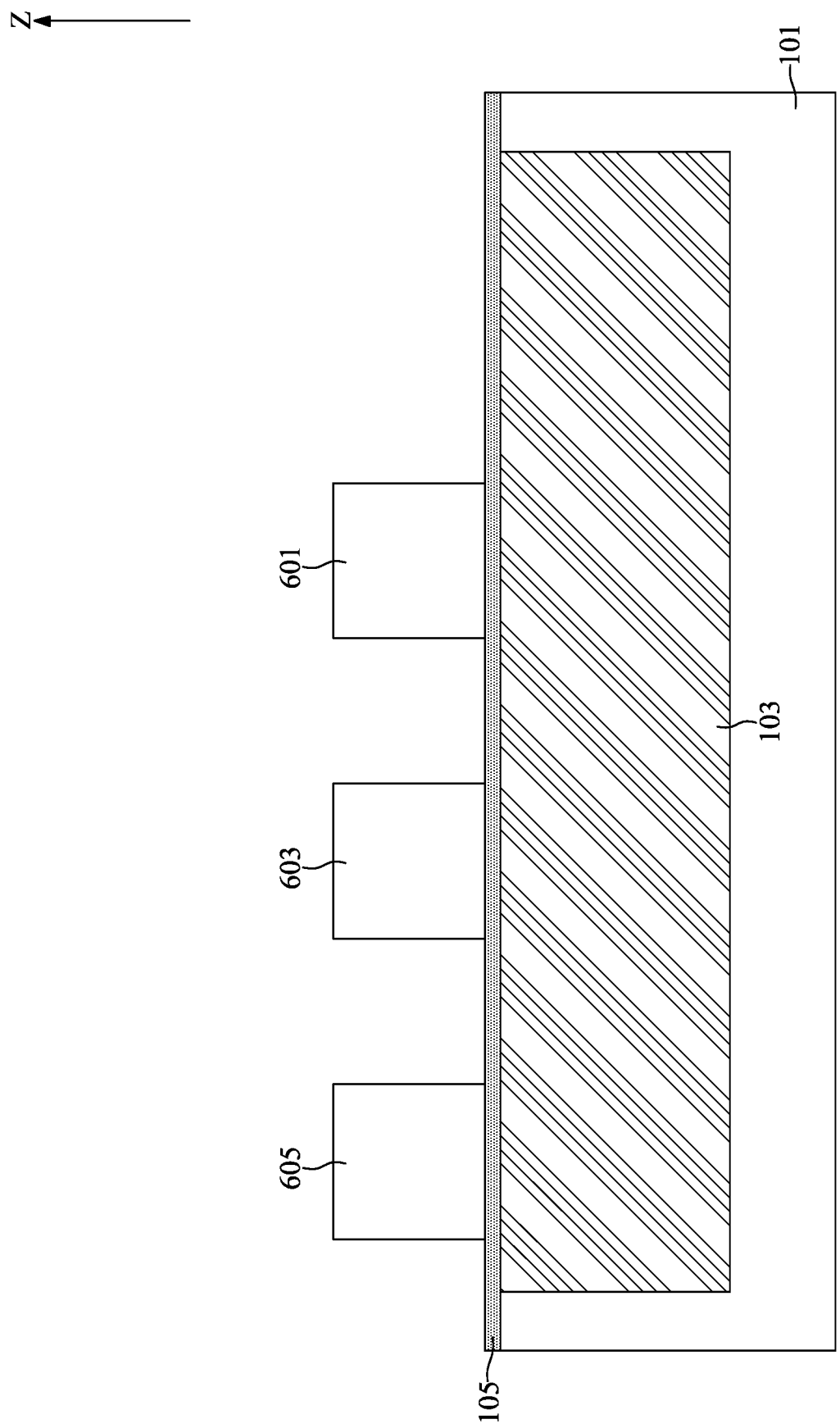

With reference to FIG. 4, intermediate conductive layers 601, 603, 605 may be formed on the insulation layer 105 and may be directly above the bottom conductive layer 103. The intermediate conductive layers 601, 603, 605 may be separated from each other. The intermediate conductive layers 601, 603, 605 may be formed of, for example, undoped polycrystalline silicon, undoped polycrystalline germanium, undoped polycrystalline silicon germanium, or a combination thereof. It should be noted that the number of the intermediate conductive layers is just for exemplary purpose. The number of the intermediate conductive layers may be greater than or less than three. For example, the number of the intermediate conductive layers can be two. For another example, the number of the intermediate conductive layers can be four.

Figure 5:
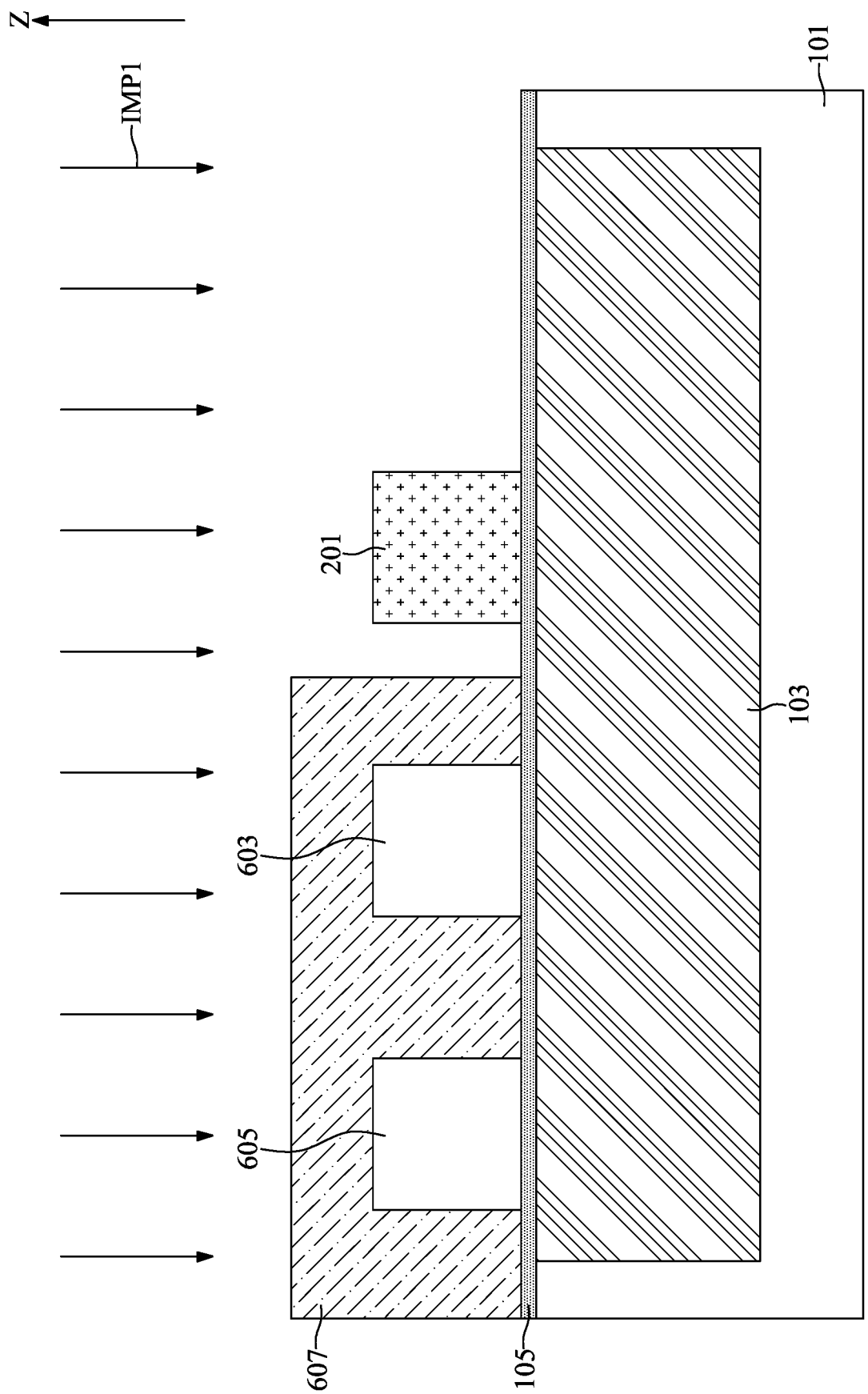

With reference to FIG. 5, a mask layer 607 may be formed on the insulation layer 105. The mask layer 607 may cover the intermediate conductive layers 603, 605 and expose the intermediate conductive layer 601 (as shown in FIG. 4). In some embodiments, the mask layer 607 may be a photoresist layer. A first implantation process IMP1 may be subsequently performed to dope dopants into the intermediate conductive layer 601 and turn the intermediate conductive layer 601 into the first conductive layer 201. The dopants may be p-type dopants such as boron, aluminum, gallium, and indium or n-type dopants such as antimony, arsenic, and phosphorous. The dopant concentration of the first implantation process IMP1 may be between about 1E19 atoms/$cm^2$ and about 1E21 atoms/$cm^2$. The first conductive layer 201 may have a first dopant concentration. After the first implantation process IMP1, the mask layer 607 may be removed.

Figure 6:
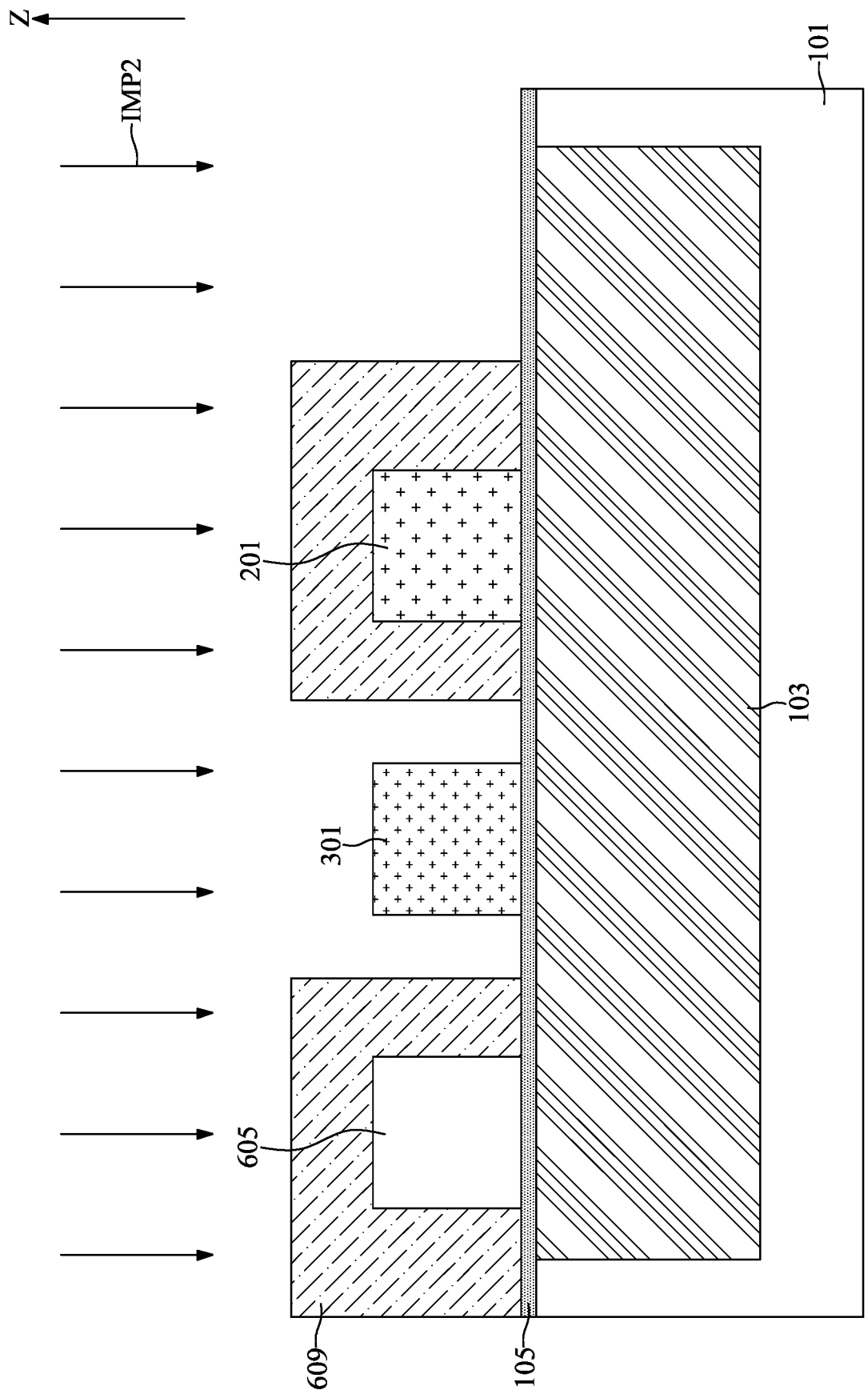

With reference to FIG. 6, a mask layer 609 may be formed on the insulation layer 105. The mask layer 609 may cover the intermediate conductive layer 605 and the first conductive layer 201 and expose the intermediate conductive layer 603 (as shown in FIG. 4). In some embodiments, the mask layer 609 may be a photoresist layer. A second implantation process IMP2 may be subsequently performed to dope dopants into the intermediate conductive layer 605 and turn the intermediate conductive layer 605 into the second conductive layer 301. The dopants may be p-type dopants such as boron, aluminum, gallium, and indium or n-type dopants such as antimony, arsenic, and phosphorous. The dopant concentration of the second implantation process IMP2 may be between about 1E19 atoms/$cm^2$ and about 1E21 atoms/$cm^2$. In some embodiments, the dopant type used in the first implantation process IMP1 and the dopant type used in the second implantation process IMP2 are the same. In some embodiments, the dopants used in the first implantation process IMP1 and the dopants used in the second implantation process IMP2 are the same. The second conductive layer 301 may have a second dopant concentration. After the second implantation process IMP2, the mask layer 609 may be removed.

Figure 7:
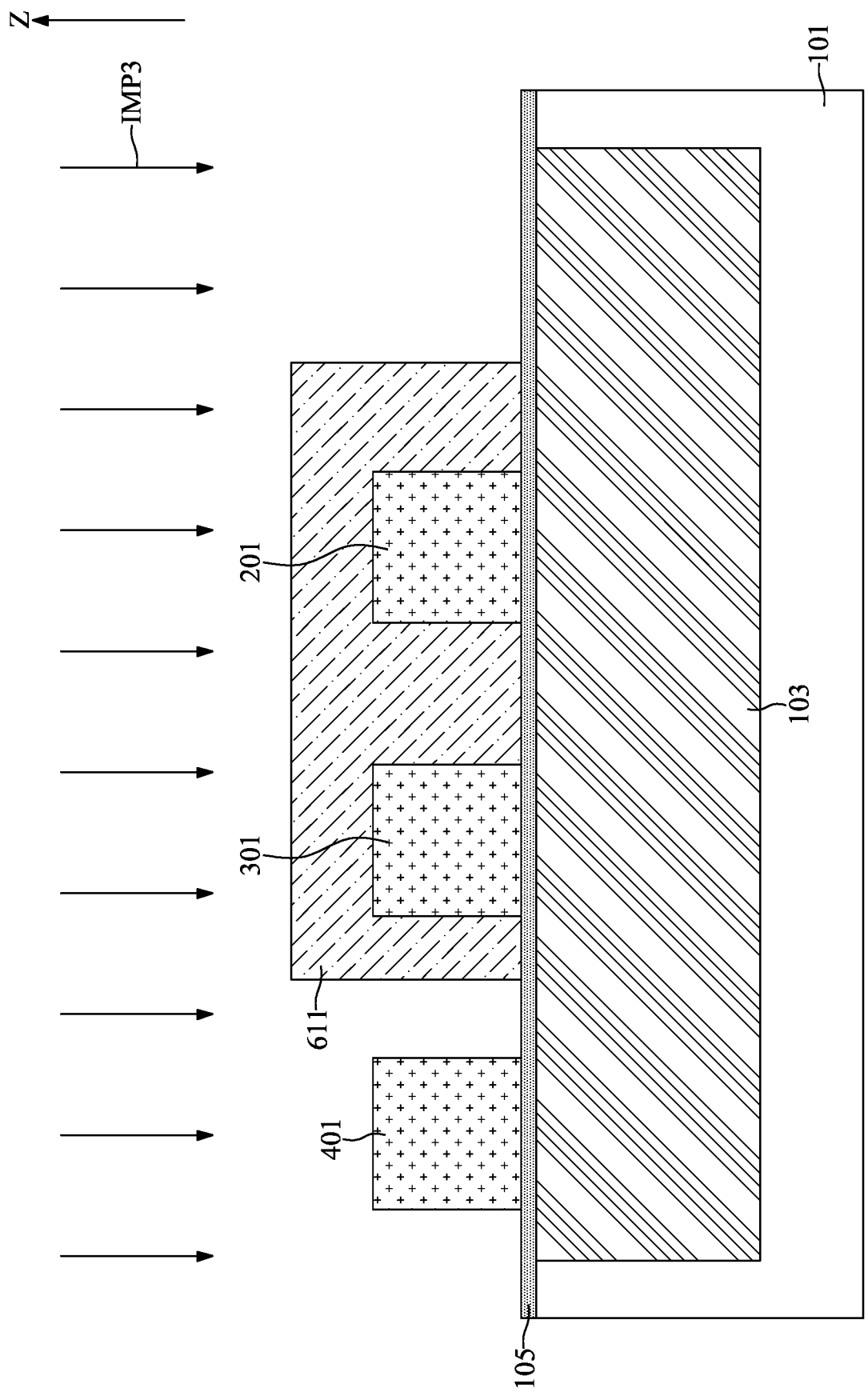

With reference to FIG. 7, a mask layer 611 may be formed on the insulation layer 105. The mask layer 611 may cover the first conductive layer 201 and the second conductive layer 301 and expose the intermediate conductive layer 605. In some embodiments, the mask layer 611 may be a photoresist layer. A third implantation process IMP3 may be subsequently performed to dope dopants into the intermediate conductive layer 605 and turn the intermediate conductive layer 605 into the third conductive layer 401. The dopants may be p-type dopants such as boron, aluminum, gallium, and indium or n-type dopants such as antimony, arsenic, and phosphorous. The dopant concentration of the third implantation process IMP3 may be between about 1E19 atoms/$cm^2$ and about 1E21 atoms/$cm^2$. In some embodiments, the dopant type used in the third implantation process IMP3 and the dopant type used in the second implantation process IMP2 are the same. In some embodiments, the dopants used in the third implantation process IMP3 and the dopants used in the second implantation process IMP2 are the same. The third conductive layer 401 may have a third dopant concentration. After the third implantation process IMP3, the mask layer 611 may be removed.

In some embodiments, the first dopant concentration of the first conductive layer 201, the second dopant concentration of the second conductive layer 301, the third dopant concentration of the third conductive layer 401 may be different. For example, the third dopant concentration of the third conductive layer 401 may be greater than the second dopant concentration of the second conductive layer 301 and the first dopant concentration of the first conductive layer 201. The second dopant concentration of the second conductive layer 301 may be greater than the first dopant concentration of the first conductive layer 201. It should be note that the dopant concentration order of the first conductive layer 201, the second conductive layer 301, and the third conductive layer 401 may be illustrative only. The dopant concentration order can be vary depending on circuit design.

In some embodiments, an anneal process may be performed to activate the first conductive layer 201, the second conductive layer 301, and the third conductive layer 401. The temperature of the anneal process may be between about 800° C. and about 1250° C. The anneal process may have a process duration between about 1 millisecond and about 500 milliseconds. The anneal process may be, for example, a rapid thermal anneal, a laser spike anneal, or a flash lamp anneal.

Figure 8:
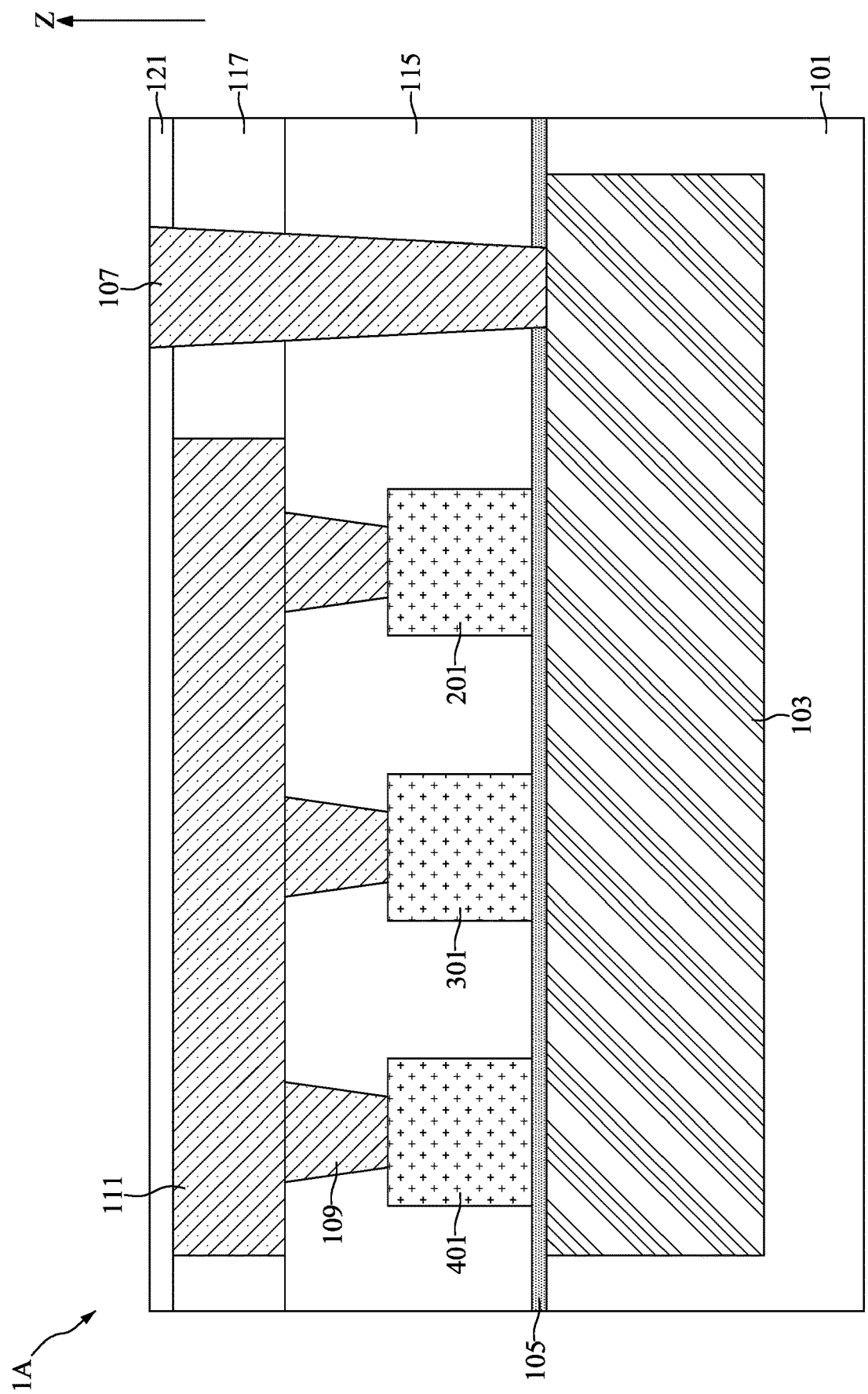

With reference to FIGS. 1 and 8, at Step S17, a top conductive layer 111 may be formed to electrically couple to the first conductive layer 201, the second conductive layer 301, and the third conductive layer 401 and a conductive plug 107 may be formed to electrically couple to the bottom conductive layer 103.

With reference to FIG. 8, an inter-dielectric layer 115 may be formed on the insulation layer 105 to cover the first conductive layer 201, the second conductive layer 301, and the third conductive layer 401. The inter-dielectric layer 115 may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetraethyl orthosilicate, fluoride silicate glass, carbon-doped silicon oxide, or a combination thereof. The inter-dielectric layer 115 may be formed by, for example, chemical vapor deposition, plasma-enhanced chemical vapor deposition, or the like. A planarization process, such as chemical mechanical polishing, may be performed to provide a substantially flat surface for subsequent processing steps.

With reference to FIG. 8, conductive vias 109 may be formed in the inter-dielectric layer 115. The conductive vias 109 may be respectively formed on the first conductive layer 201, the second conductive layer 301, and the third conductive layer 401. In some embodiments, the sidewalls of each of the conductive vias 109 may have a slanted cross-sectional profile. In some embodiments, the conductive vias 109 may be formed by a damascene method. Generally, in the damascene method, one or more dielectric materials, such as the low-k dielectric materials (i.e., having a dielectric constant <4.0), are deposited and pattern etched to form the vertical interconnects, also known as vias, and horizontal interconnects, also known as lines. Conductive materials, such as copper containing materials, and other materials, such as barrier layer materials used to prevent diffusion of copper containing materials into the surrounding low-k dielectric, are then inlaid into the etched pattern. Any excess copper containing materials and excess barrier layer material-external to the etched pattern, such as on the field of the substrate, is then removed.

With reference to FIG. 8, an inter-dielectric layer 117 may be formed on the inter-dielectric layer 115. In some embodiments, the inter-dielectric layer 117 may be formed of a same material as the inter-dielectric layer 115 but is not limited thereto.

With reference to FIG. 8, the top conductive layer 111 may be formed in the inter-dielectric layer 117. The top conductive layer 111 may be formed on the conductive vias 109. The top conductive layer 111 may be electrically coupled to the first conductive layer 201, the second conductive layer 301, and the third conductive layer 401 through the conductive vias 109. The top conductive layer 111 may be electrically coupled to an external voltage during a programming procedure. The top conductive layer 111 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The top conductive layer 111 may be formed by, for example, a damascene process.

In some embodiments, the first conductive layer 201, the second conductive layer 301, and the third conductive layer 401 may be electrically coupled to different conductive layers and may be electrically coupled different external voltages during programming procedures.

With reference to FIG. 8, an inter-dielectric layer 121 may be formed on the inter-dielectric layer 117. In some embodiments, the inter-dielectric layer 121 may be formed of a same material as the inter-dielectric layer 117. In some embodiments, the inter-dielectric layer 121 may be an etch stop layer and may be formed of, for example, silicon nitride, silicon carbonitride, or the like. The inter-dielectric layer 121 may be formed by, for example, atomic layer deposition, chemical vapor deposition, or the like.

With reference to FIG. 8, the conductive plug 107 may be formed along the inter-dielectric layer 121, the inter-dielectric layer 117, the inter-dielectric layer 115, and the insulation layer 105, and on the bottom conductive layer 103. The conductive plug 107 may be electrically connected to the bottom conductive layer 103. The conductive plug 107 may be electrically coupled to a biased voltage or ground potential. In some embodiments, the conductive plug 107 may have a slanted cross-sectional profile. The conductive plug 107 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIG. 8, the first conductive layer 201, the second conductive layer 301, the third conductive layer 401, the insulation layer 105, and the bottom conductive layer 103 together configure a programmable unit. The configuration of the first conductive layer 201—the insulation layer 105—the bottom conductive layer 103, the configuration of the second conductive layer 301—the insulation layer 105—the bottom conductive layer 103, and the configuration of the third conductive layer 401—the insulation layer 105—the bottom conductive layer 103 may be referred to as three capacitor-like structures (i.e., conductor-insulator-conductor structure).

For a capacitor-like structure having n-type conductors, mobile carriers (electrons) may accumulate at the surface of the insulator when a voltage greater (i.e., larger in value) than the flat band voltage of the capacitor-like structure is applied. For a capacitor-like structure having p-type conductors, mobile carriers (holes) may accumulate at the surface of the insulator when a voltage deeper (i.e., smaller in value) than the flat band voltage of the capacitor-like structure is applied. When mobile carriers of a capacitor-like structure are accumulated at the surface of the insulator, the capacitor-like structure operates in accumulation mode. As the flat band voltage of a capacitor-like structure is associated with the work function of the capacitor-like structure and the work function of a capacitor-like structure is associated with the dopant concentration of the capacitor-like structure, the flat band voltage of a capacitor-like structure is associated with the dopant concentration of the capacitor-like structure.

In one embodiment of the present disclosure, the bottom conductive layer 103 is formed of silicon doped with n-type dopant. The first conductive layer 201, the second conductive layer 301, and the third conductive layer 401 are formed of polycrystalline silicon doped with n-type dopant. The third dopant concentration of the third conductive layer 401 may be greater than the second dopant concentration of the second conductive layer 301. The second dopant concentration of the second conductive layer 301 may be greater than the first dopant concentration of the first conductive layer 201. In such embodiment, the first flat band voltage of the first conductive layer 201 is greater than the second flat band voltage of the second conductive layer 301 and the second flat band voltage of the second conductive layer 301 is greater than the third flat band voltage of the third conductive layer 401. For example, the first flat voltage of the first conductive layer 201 is 4.0 volts, the second voltage of the second conductive layer 301 is 3.0 volts, and the third voltage of the third conductive layer 401 is 2.0 volts. As the flat band voltage of the first conductive layer 201, the second conductive layer 301, and the third conductive layer 401 are different, different voltages may be used to respectively operate the first conductive layer 201, the second conductive layer 301, and the third conductive layer 401 in the accumulation mode.

In a programming procedure of current embodiment, a programming voltage may be applied to the semiconductor device 1A through the top conductive layer 111 and the conductive plug 107 may be electrically coupled to ground potential. The insulation layer 105 may be stressed under the programming voltage. As a result, the insulation layer 105 may be ruptured to form a contiguous path(s) connecting the bottom conductive layer 103 and the first conductive layer 201, the second conductive layer 301, or the third conductive layer 401. By adjusting the value of the programming voltage, the number of the contiguous path(s) formed can be controlled. That is, the resistance of the programmable unit after the programming procedure can be fine-tuned by controlling the programming voltage.

For example, when the programming voltage is 2.5 volts, only the contiguous path of the third conductive layer 401 and the bottom conductive layer 103 is formed. For another example, when the programming voltage is 3.5 volts, the contiguous path of the third conductive layer 401 and the bottom conductive layer 103 and the contiguous path of the second conductive layer 301 and the bottom conductive layer 103 are formed. For yet another example, when the programming voltage is 4.5 volts, all contiguous paths are formed.

In another embodiment of the present disclosure, the bottom conductive layer 103 is formed of silicon doped with p-type dopant. The first conductive layer 201, the second conductive layer 301, and the third conductive layer 401 are formed of polycrystalline silicon doped with p-type dopant. The third dopant concentration of the third conductive layer 401 may be greater than the second dopant concentration of the second conductive layer 301. The second dopant concentration of the second conductive layer 301 may be greater than the first dopant concentration of the first conductive layer 201. In such embodiment, the first flat band voltage of the first conductive layer 201 is shallower (i.e., closer to ground potential) than the second flat band voltage of the second conductive layer 301 and the second flat band voltage of the second conductive layer 301 is shallower than the third flat band voltage of the third conductive layer 401. For example, the first flat voltage of the first conductive layer 201 is −2.0 volts, the second voltage of the second conductive layer 301 is −3.0 volts, and the third voltage of the third conductive layer 401 is −4.0 volts. As the flat band voltage of the first conductive layer 201, the second conductive layer 301, and the third conductive layer 401 are different, different voltages may be used to respectively operate the first conductive layer 201, the second conductive layer 301, and the third conductive layer 401 in the accumulation mode.

Exemplary programming procedures may be as follow. When the programming voltage is −2.5 volts, only the contiguous path of the third conductive layer 401 and the bottom conductive layer 103 is formed. For another example, when the programming voltage is −3.5 volts, the contiguous path of the third conductive layer 401 and the bottom conductive layer 103 and the contiguous path of the second conductive layer 301 and the bottom conductive layer 103 are formed. For yet another example, when the programming voltage is −4.5 volts, all contiguous paths are formed.

FIGS. 9 to 13 illustrate, in schematic cross-sectional view diagrams, semiconductor devices 1B, 1C, 1D, 1E, and 1F in accordance with some embodiments of the present disclosure.

Figure 9:
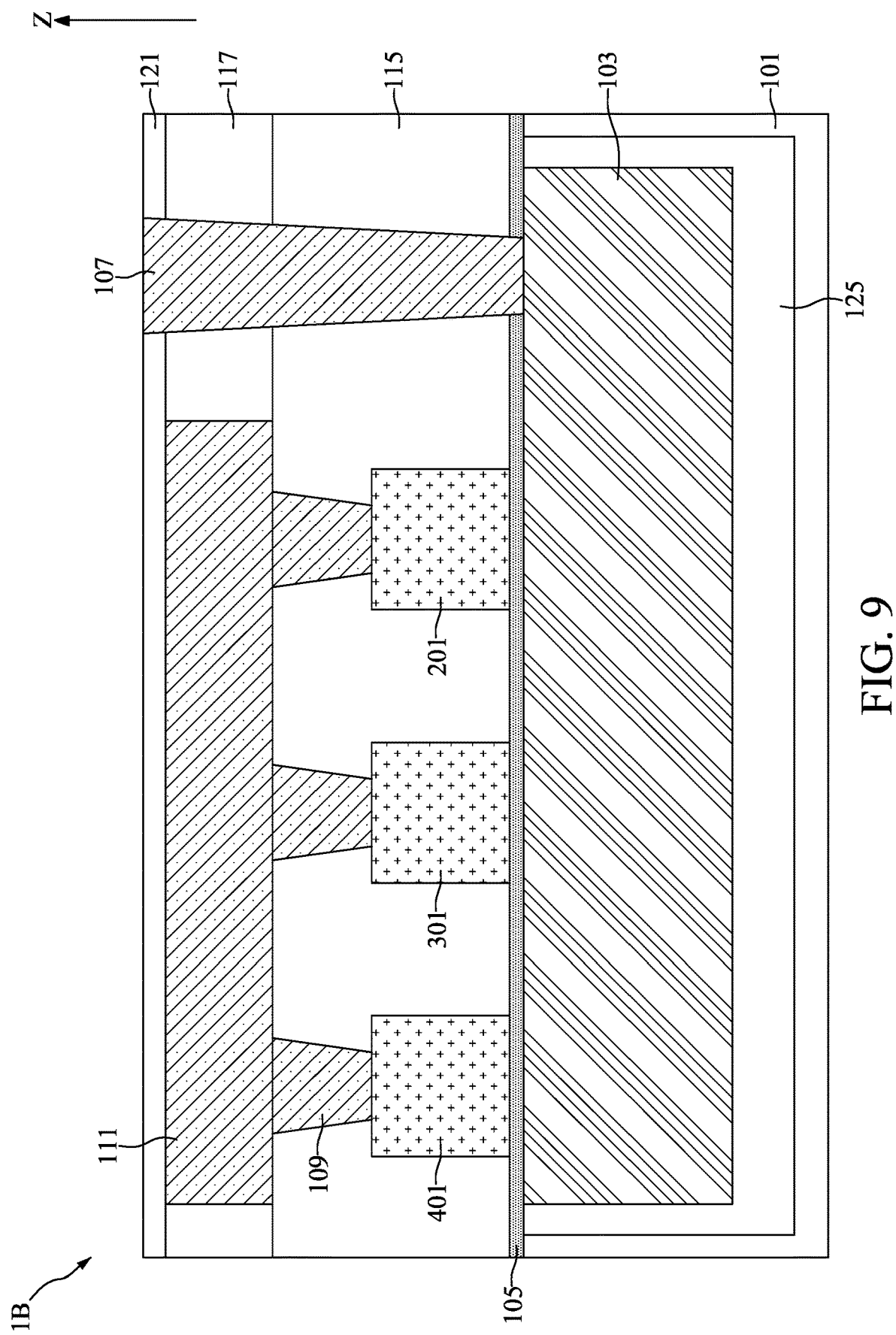
FIGS. 9 to 13 illustrate, in schematic cross-sectional view diagrams, semiconductor devices in accordance with some embodiments of the present disclosure.

With reference to FIG. 9, the semiconductor device 1B may have a structure similar to that illustrated in FIG. 8. The same or similar elements in FIG. 9 as in FIG. 8 have been marked with similar reference numbers and duplicative descriptions have been omitted. The semiconductor device 1B may include a well region 125. The well region 125 may be disposed in the substrate 101 and may surround the bottom conductive layer 103. The well region 125 may have an electrical type opposite to the bottom conductive layer 103. The well region 125 may provide additional electrical isolation to the bottom conductive layer 103.

Figure 10:
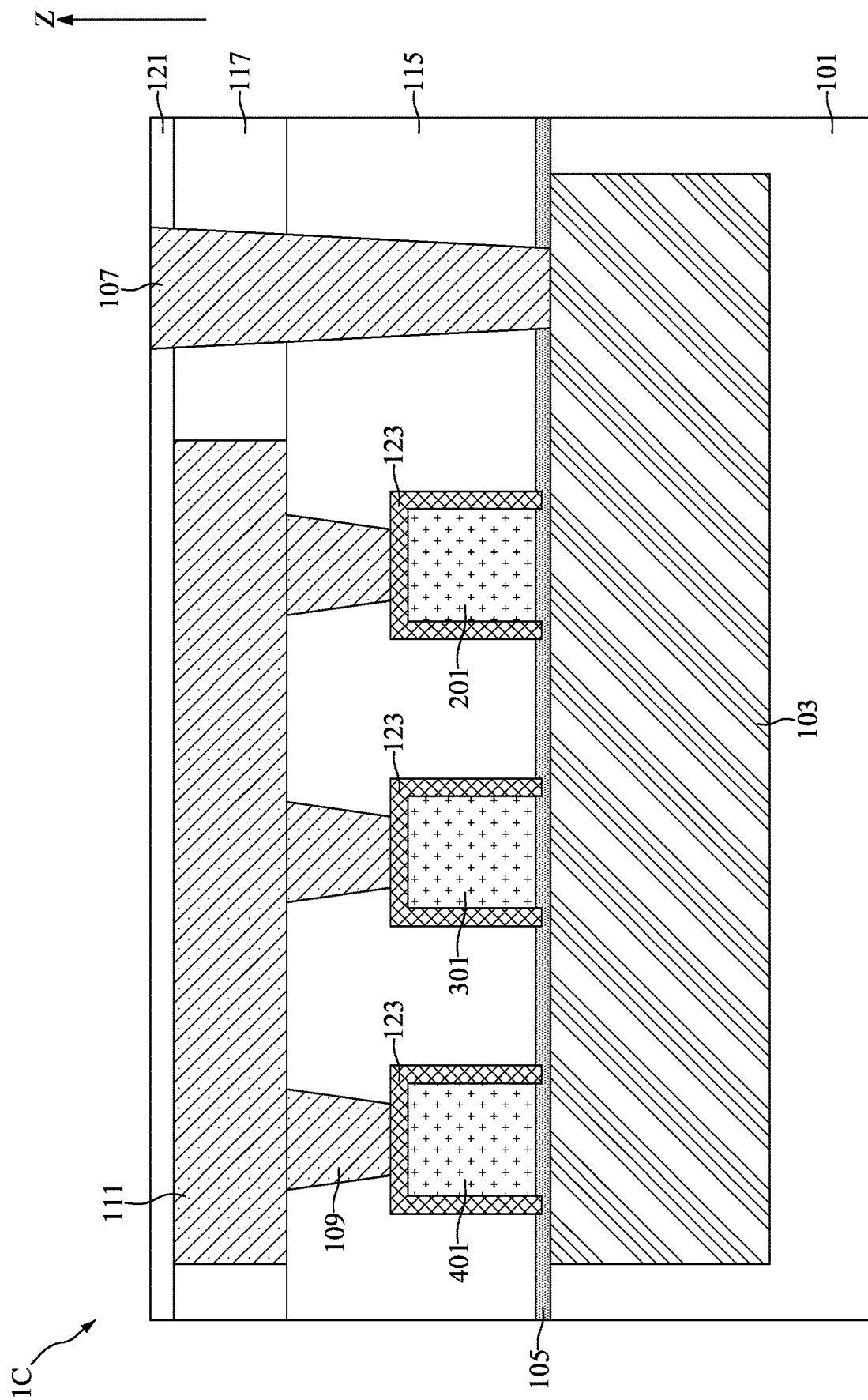

With reference to FIG. 10, the semiconductor device 1C may have a structure similar to that illustrated in FIG. 8. The same or similar elements in FIG. 10 as in FIG. 8 have been marked with similar reference numbers and duplicative descriptions have been omitted. The semiconductor device 1C may include assistance layers 123. The assistance layers 123 may be respectively correspondingly disposed covering the first conductive layer 201, the second conductive layer 301, and the third conductive layer 401. The assistance layers 123 may be formed of, for example, titanium silicide, nickel silicide, nickel platinum silicide, tantalum silicide, or cobalt silicide. The thickness of the assistance layers 123 may be between about 2 nm and about 20 nm. The assistance layers 123 may reduce the contact resistance between the conductive vias 109 and the first conductive layer 201, the second conductive layer 301, and the third conductive layer 401, respectively. In some embodiments, the assistance layers 123 may be disposed on the top surface of the first conductive layer 201, the top surface of the second conductive layer 301, and the top surface of the third conductive layer 401, respectively.

Figure 11:
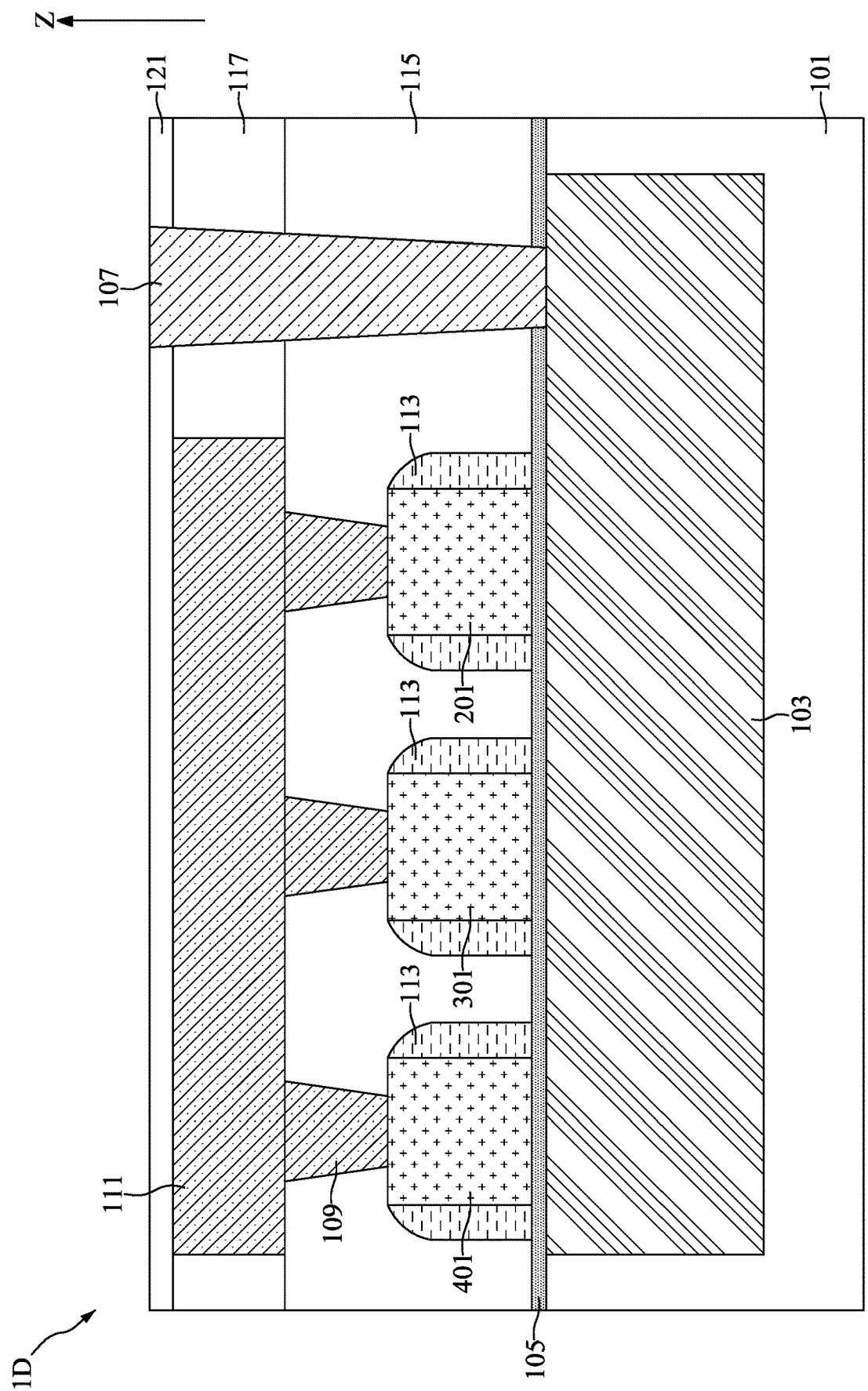

With reference to FIG. 11, the semiconductor device 1D may have a structure similar to that illustrated in FIG. 8. The same or similar elements in FIG. 11 as in FIG. 8 have been marked with similar reference numbers and duplicative descriptions have been omitted.

The semiconductor device 1D may include spacers 113. The spacers 113 may be disposed on the sidewalls of the first conductive layer 201, the sidewalls of the second conductive layer 301, and the sidewalls of the second conductive layer 301, respectively. In some embodiments, the spacers 113 may be formed of, for example, silicon oxide, silicon nitride, silicon oxynitride, silicon nitride oxide, the like, or a combination thereof. The spacers 113 may provide additional electrical isolation to the first conductive layer 201, the second conductive layer 301, and the third conductive layer 401. In some embodiments, the spacers 113 may be formed of low-k dielectric materials or porous dielectric material. The spacers 113 formed of low-k dielectric materials or porous dielectric material may reduce parasitic capacitance between the first conductive layer 201 and the second conductive layer 301 and between the second conductive layer 301 and the third conductive layer 401.

Figure 12:
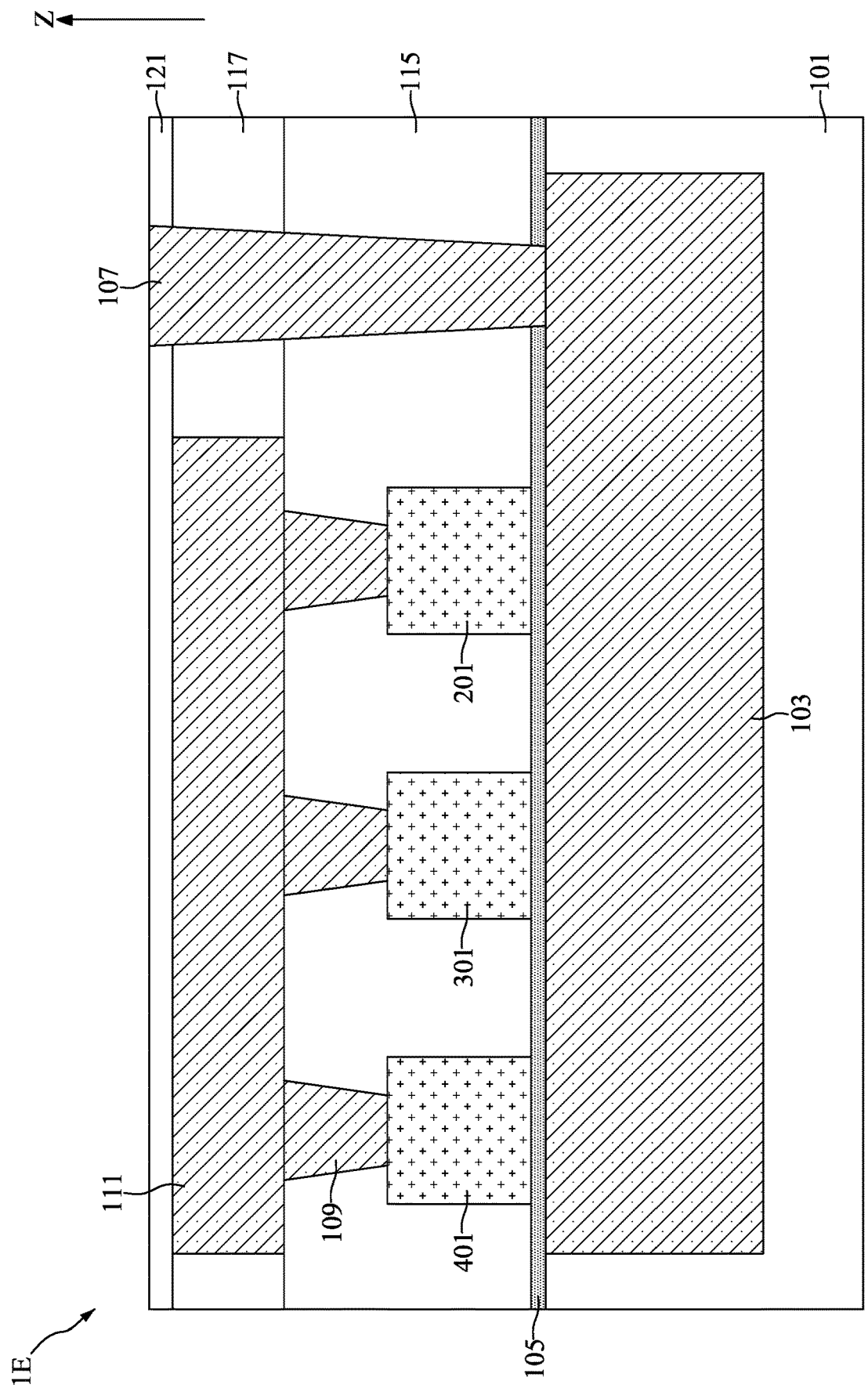

With reference to FIG. 12, the semiconductor device 1E may have a structure similar to that illustrated in FIG. 8. The same or similar elements in FIG. 12 as in FIG. 8 have been marked with similar reference numbers and duplicative descriptions have been omitted. The bottom conductive layer 103 of the semiconductor device 1E may be formed of, for example, a metallic material. The metallic material may be, for example, tungsten, cobalt, zirconium, tantalum, titanium, aluminum, ruthenium, copper, or a combination thereof.

Figure 13:
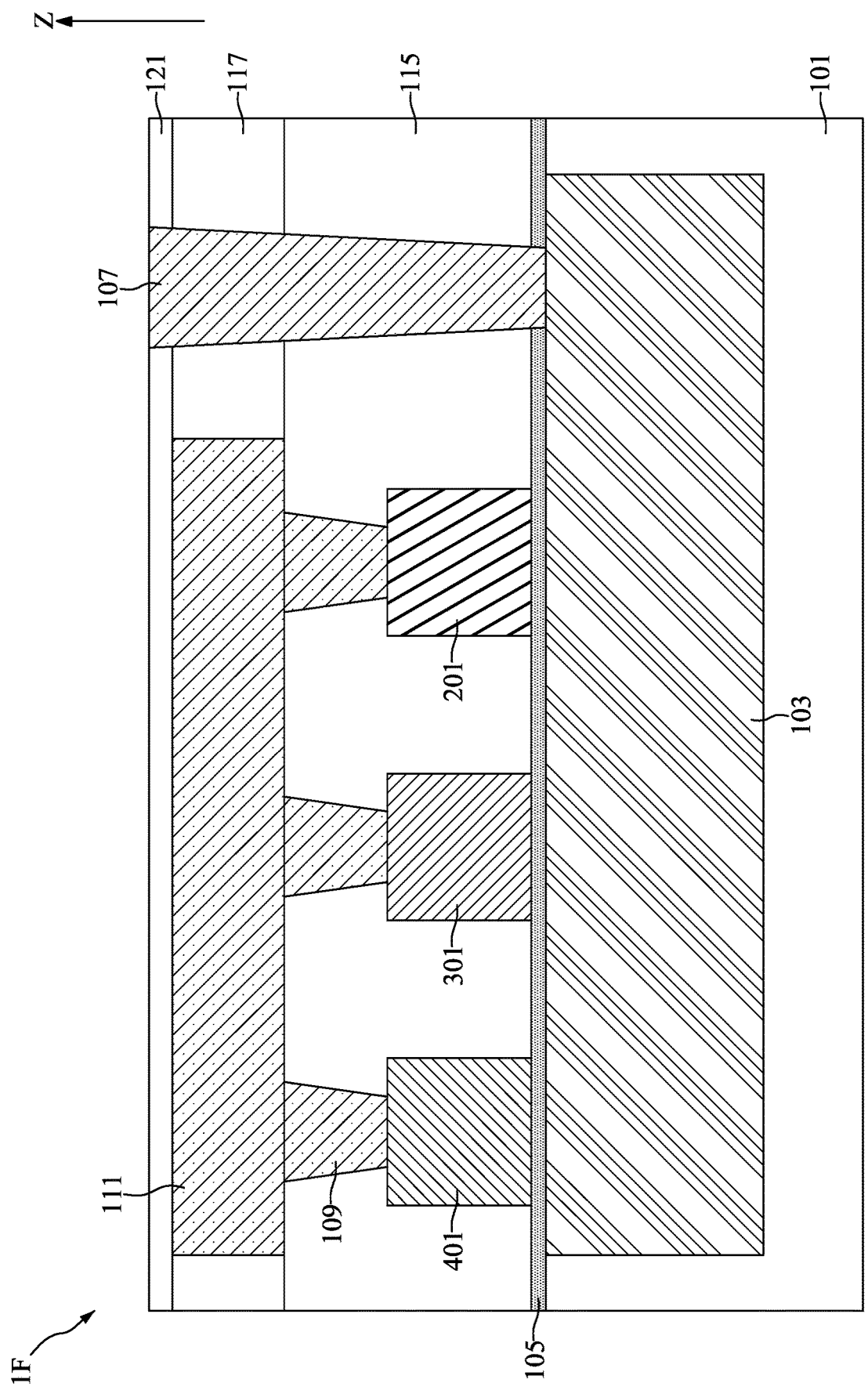

With reference to FIG. 13, the semiconductor device 1F may have a structure similar to that illustrated in FIG. 8. The same or similar elements in FIG. 13 as in FIG. 8 have been marked with similar reference numbers and duplicative descriptions have been omitted.

The first conductive layer 201, the second conductive layer 301, and the third conductive layer 401 may be formed of, for example, metallic materials such as tungsten, cobalt, zirconium, tantalum, titanium, aluminum, ruthenium, copper, platinum, or a combination thereof. The first conductive layer 201, the second conductive layer 301, and the third conductive layer 401 may be formed of different materials so as to have different work functions. For example, the first conductive layer 201 may be formed of aluminum and having a work function at +4.1 volts. The second conductive layer 301 may be formed of copper and having a work function at +4.7 volts. The third conductive layer 401 may be formed of platinum and having a work function at +6.4 volts. As the different work functions of the first conductive layer 201, the second conductive layer 301, and the third conductive layer 401, different programming voltages may be needed to program the first conductive layer 201, the second conductive layer 301, or the third conductive layer 401.

Figure 14:
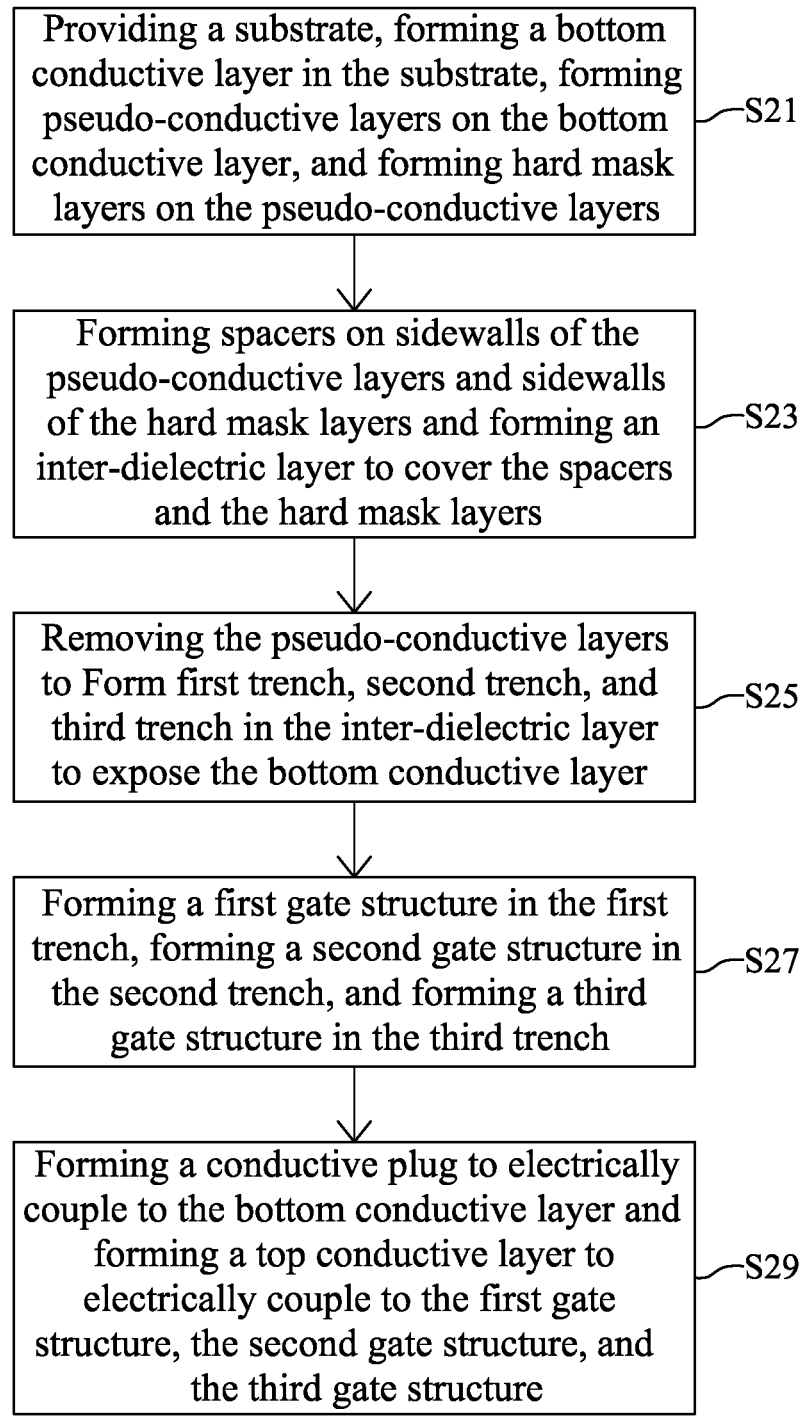
FIG. 14 illustrates, in a flowchart diagram form, a method for fabricating a semiconductor device in accordance with another embodiment of the present disclosure.

FIG. 14 illustrates, in a flowchart diagram form, a method 20 for fabricating a semiconductor device 1G in accordance with another embodiment of the present disclosure. FIGS. 15 to 28 illustrate, in schematic cross-sectional view diagrams, a flow for fabricating the semiconductor device 1G in accordance with another embodiment of the present disclosure.

Figure 15:
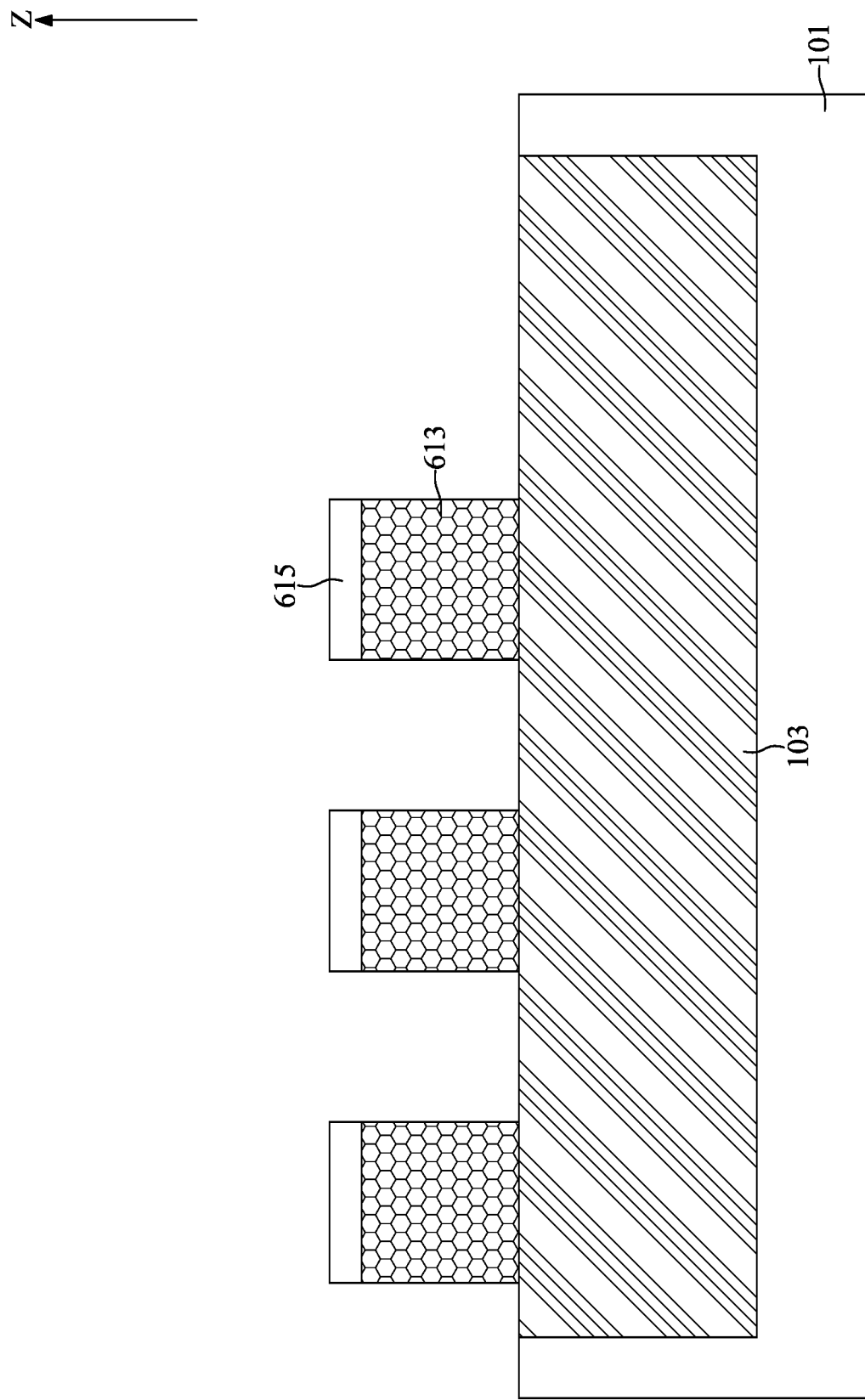
FIGS. 15 to 28 illustrate, in schematic cross-sectional view diagrams, a flow for fabricating the semiconductor device in accordance with another embodiment of the present disclosure.

With reference to FIGS. 14 and 15, at step S21, a substrate 101 may be provided, a bottom conductive layer 103 may be formed in the substrate 101, pseudo-conductive layers 613 may be formed on the bottom conductive layer 103, and hard mask layers 615 may be formed on the pseudo-conductive layers 613.

With reference to FIG. 15, the substrate 101 and the bottom conductive layer 103 may be formed with a procedure similar to that illustrated in FIG. 2. The pseudo-conductive layers 613 may be separated from each other. The pseudo-conductive layers 613 may be formed of, for example, amorphous silicon or polycrystalline silicon. The hard mask layers 615 may be formed of, for example, silicon nitride, silicon oxynitride, silicon nitride oxide, or the like.

Figure 16:
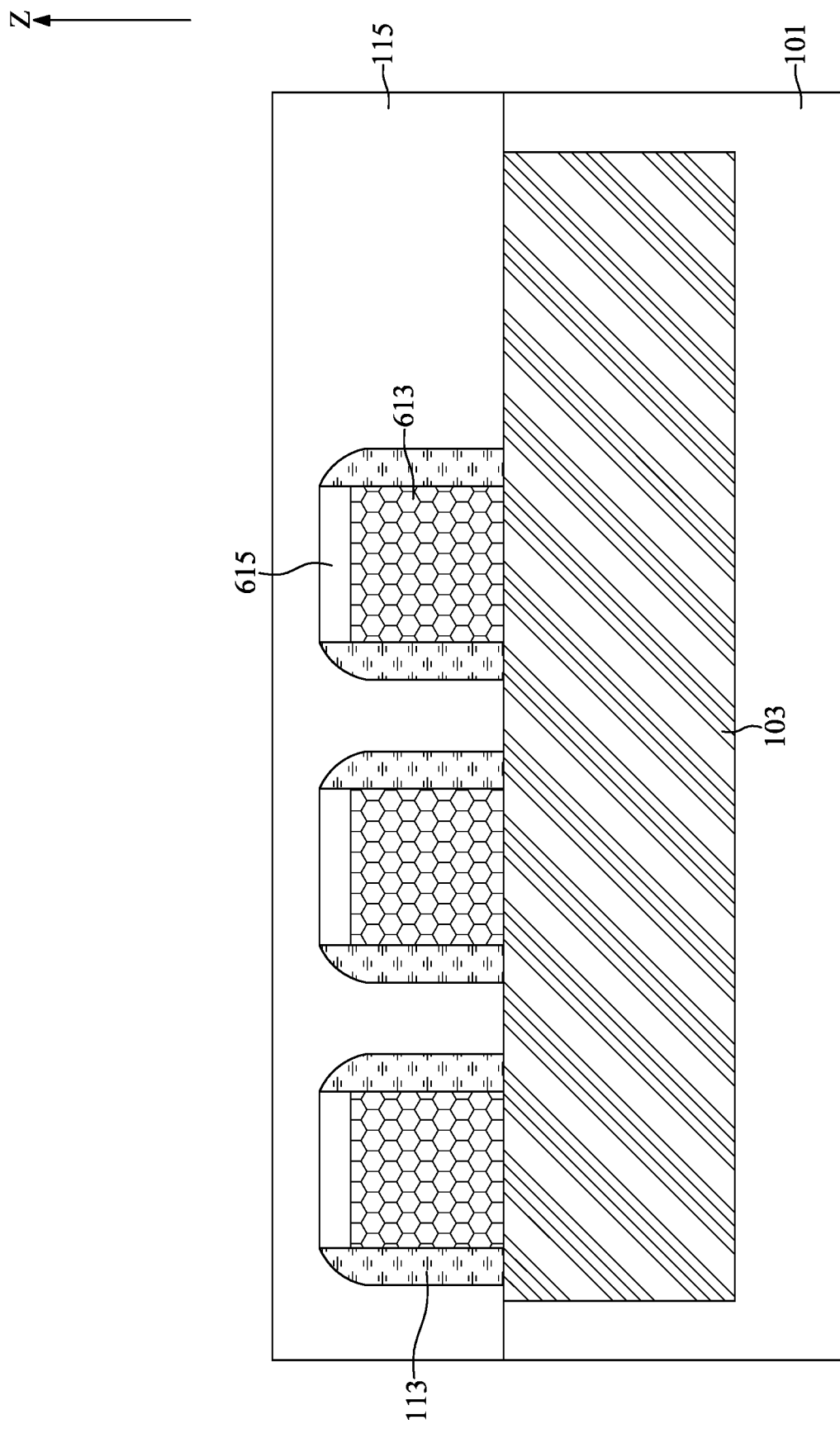

With reference to FIGS. 14 and 16, at step S23, spacers 113 may be formed on sidewalls of the pseudo-conductive layers 613 and sidewalls of the hard mask layers 615 and an inter-dielectric layer 115 may be formed to cover the spacers 113 and the hard mask layers 615.

With reference to FIG. 16, a layer of insulating material may be deposited to cover the pseudo-conductive layers 613 and the hard mask layers 615. An etch process, such as an anisotropic dry etch process, may be subsequently performed to remove portions of the layer of insulating material and concurrently form the spacers 113. The inter-dielectric layer 115 may be formed by a deposition process such as chemical vapor deposition. A planarization process, such as chemical mechanical polishing, may be performed onto the inter-dielectric layer 115 to provide a substantially flat surface for subsequent processing steps.

Figure 17:
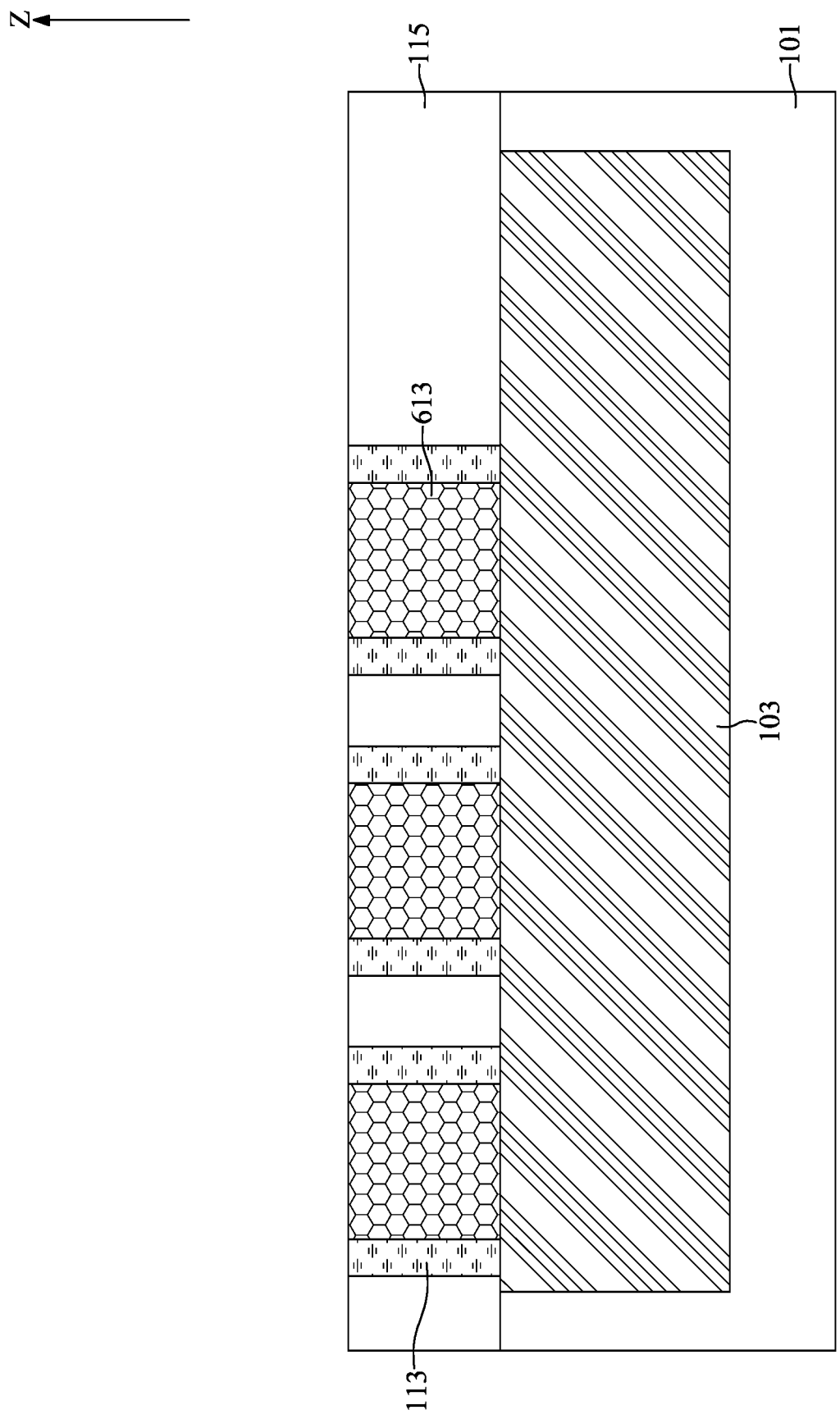
Figure 18:
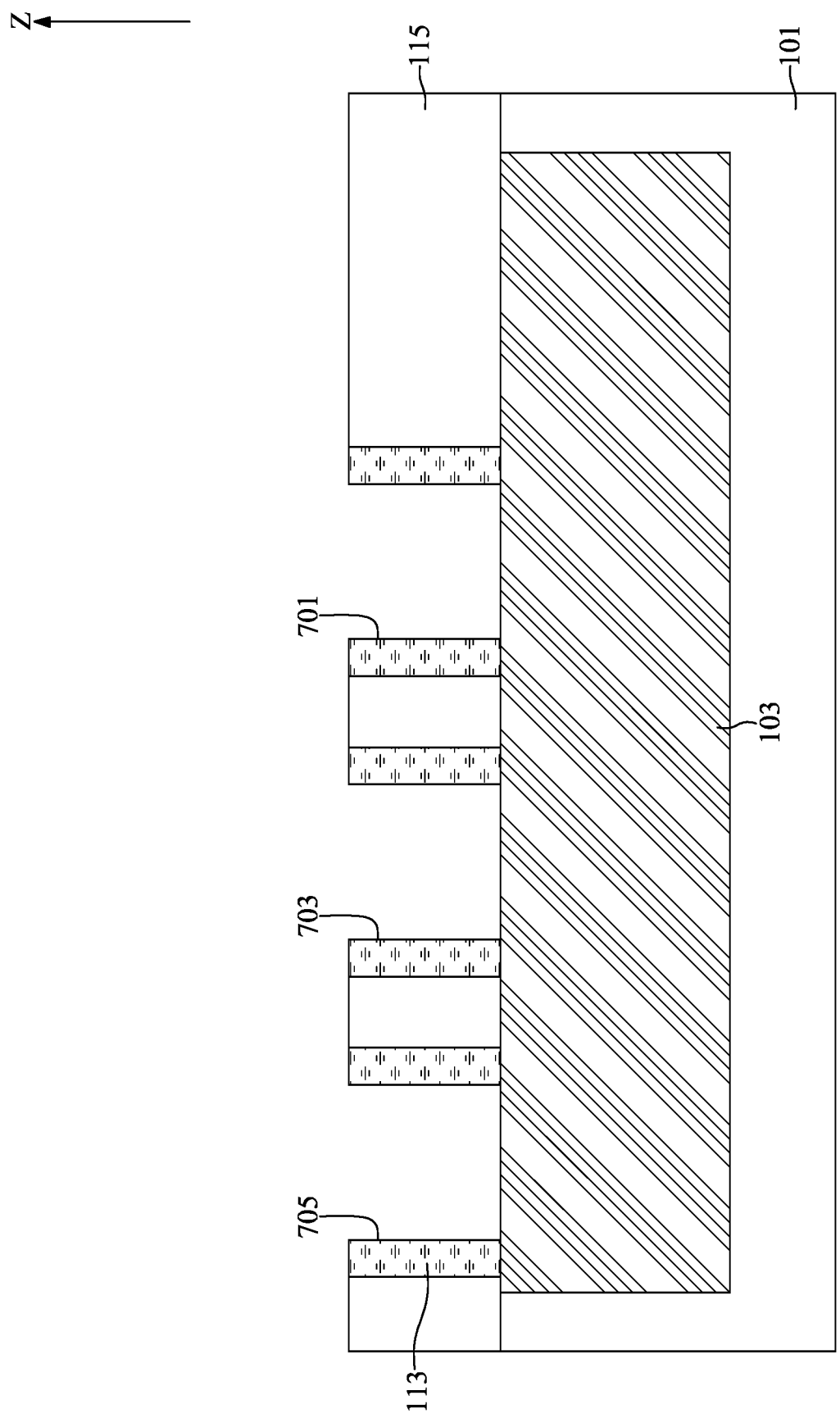

With reference to FIGS. 14, 17, and 18, at Step S25, removing the intermediate conductive layer 603 to form first trench 701, second trench 703, and third trench 705 in the inter-dielectric layer 115 to expose portions of the bottom conductive layer 103.

With reference to FIG. 17, a planarization process, such as chemical mechanical polishing, may be performed to remove the hard mask layers 615 and portions of the spacers 113 and to expose the pseudo-conductive layers 613.

With reference to FIG. 18, an etch process, such as an anisotropic dry etch process, may be performed to remove the pseudo-conductive layers 613 and concurrently form the first trench 701, the second trench 703, and the third trench 705. Portions of the top surface of bottom conductive layer 103 may be exposed through the first trench 701, the second trench 703, and the third trench 705.

With reference to FIG. 14 and FIGS. 19 to 27, at Step S27, a first gate structure 200 may be formed in the first trench 701, a second gate structure 300 may be formed in the second trench 703, and a third gate structure 400 may be formed in the third trench 705.

Figure 19:
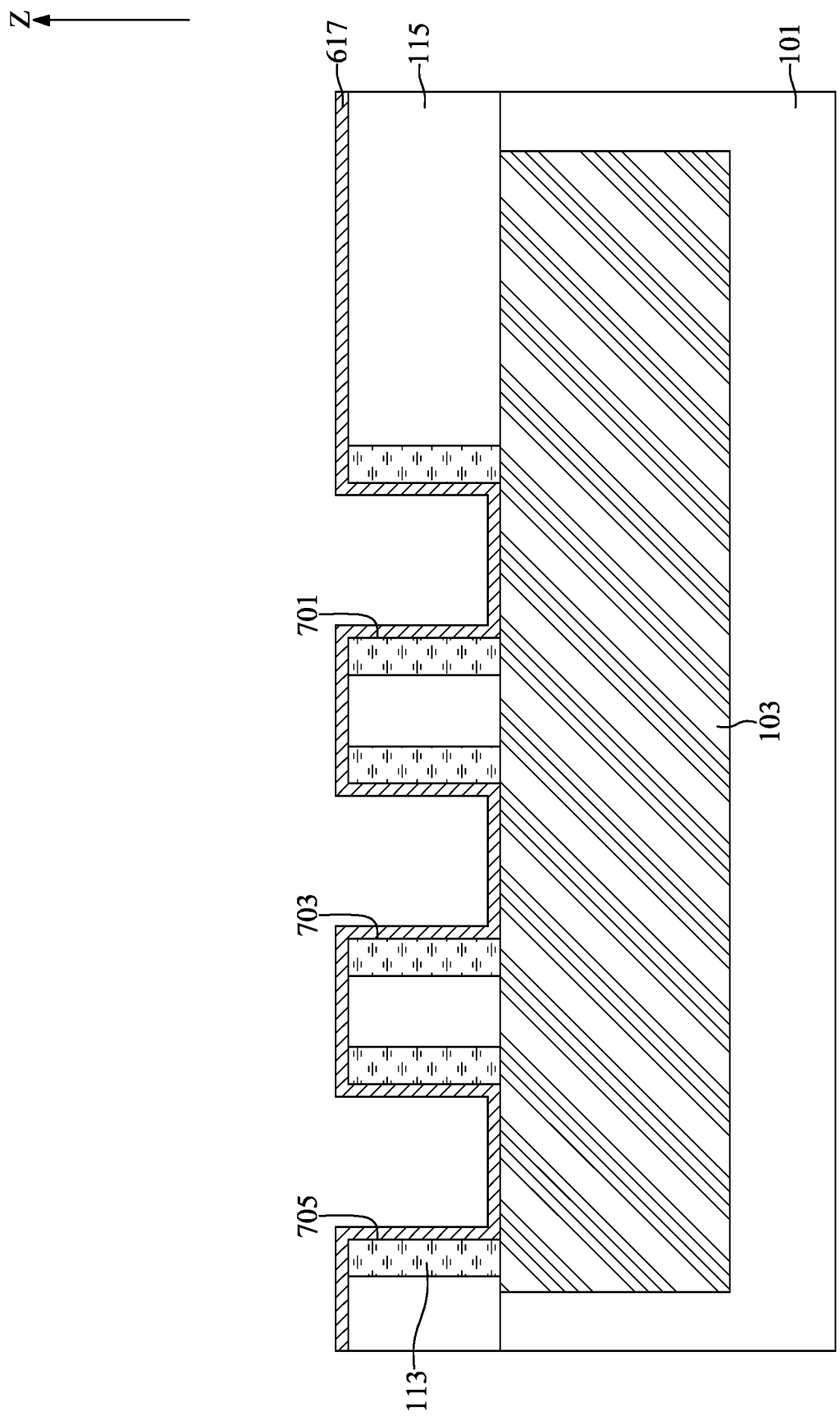

With reference to FIG. 19, a layer of dielectric material 617 may be conformally formed over the intermediate semiconductor device illustrated in FIG. 18. The dielectric material 617 may be, for example, silicon oxide, silicon nitride, hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, or lead zinc niobate.

Figure 20:
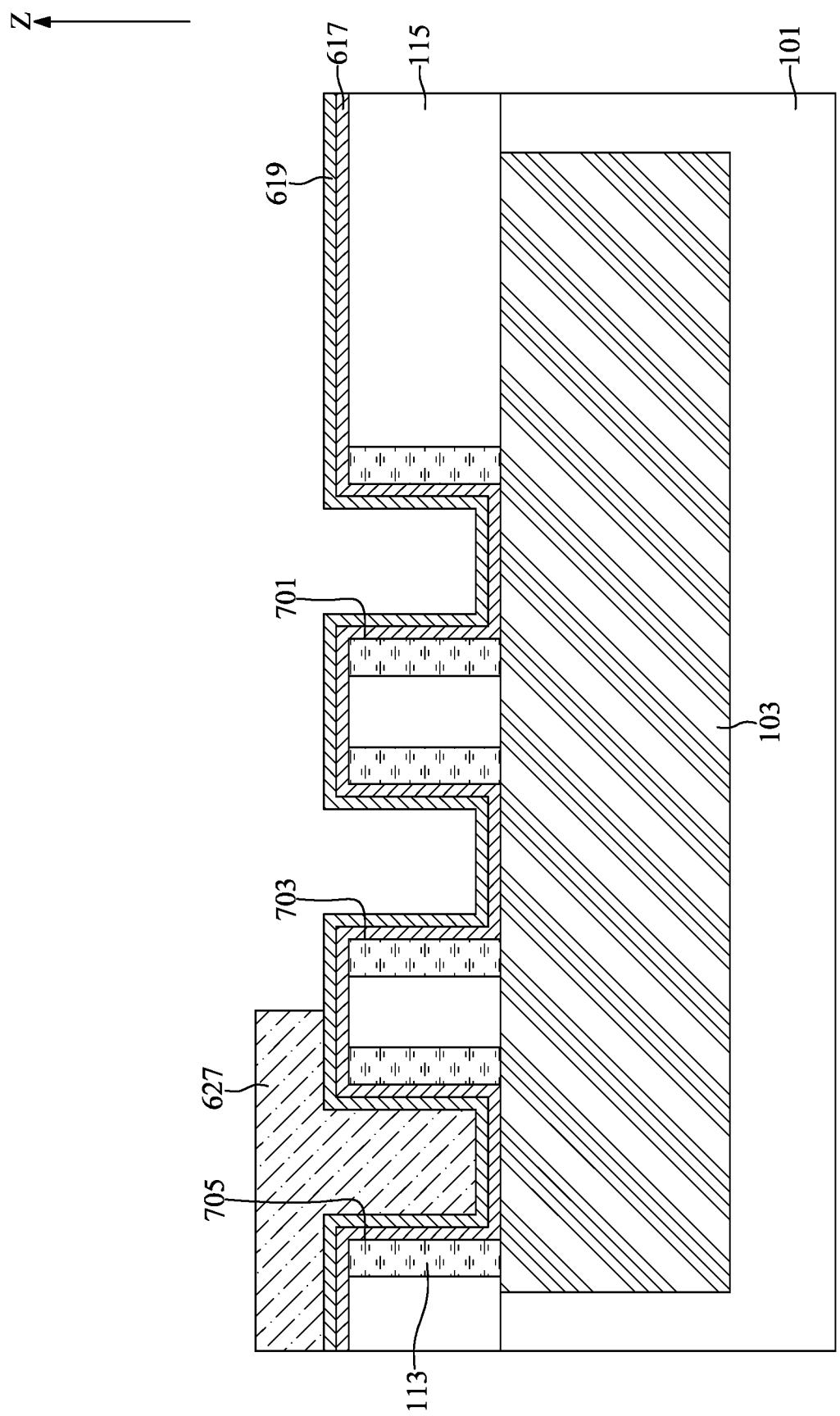

With reference to FIG. 20, a layer of first work function material 619 may be conformally formed on the layer of dielectric material 617. The first work function material 619 may be, for example, ruthenium, palladium, platinum, cobalt, nickel, and conductive metal oxides, titanium nitride, hafnium, zirconium, titanium, tantalum, aluminum, metal carbides (e.g., hafnium carbide, zirconium carbide, titanium carbide, and aluminum carbide), aluminides, or a combination thereof. A mask layer 627 may be formed on the layer of first work function material 619 to cover the third trench 705 and expose the second trench 703 and the first trench 701.

Figure 21:
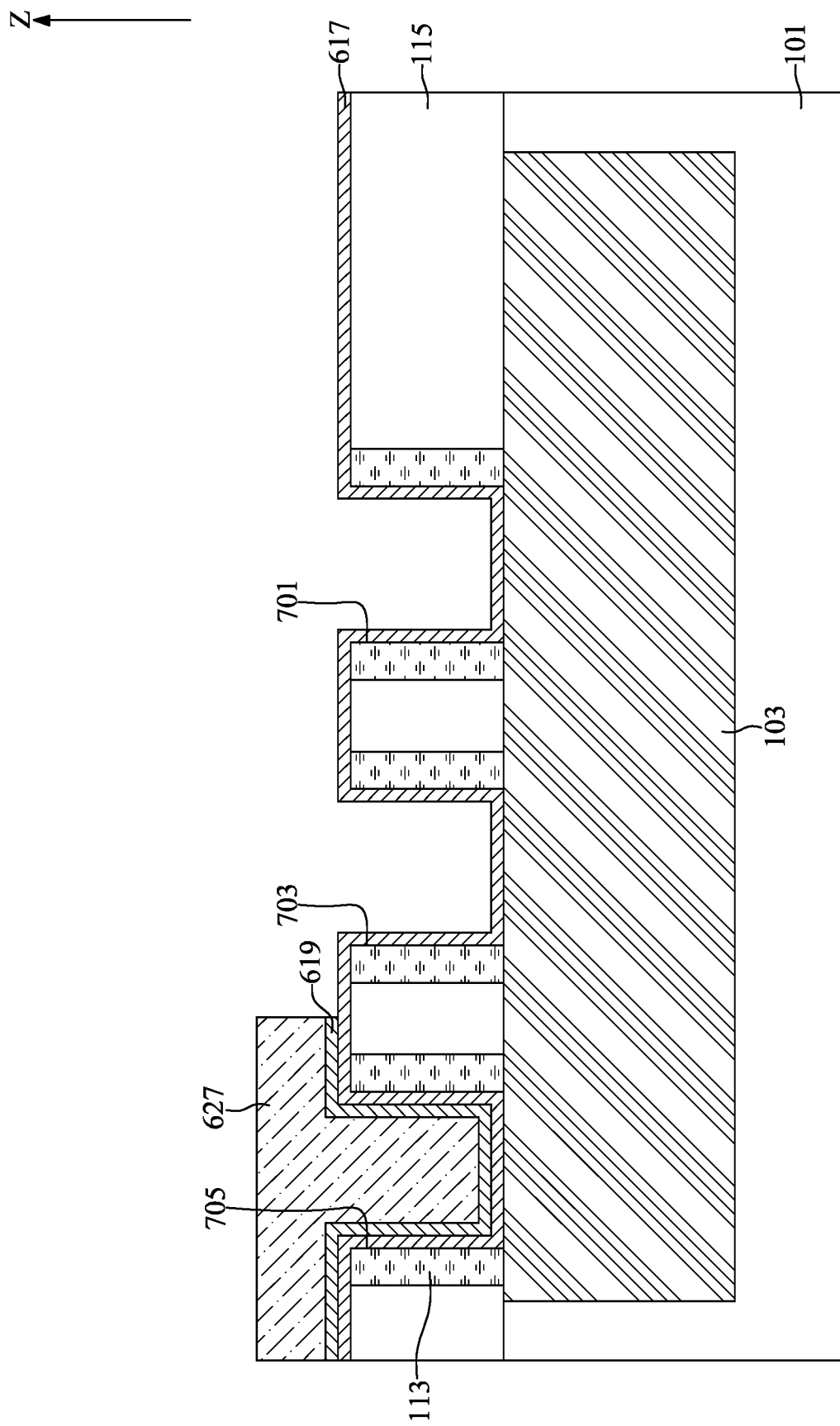

With reference to FIG. 21, an etch process may be performed to selectively remove the exposed portion of the layer of first work function material 619. The etch rate ratio of the first work function material 619 to the dielectric material 617 may be between about 15:1 and about 2:1 or between about 10:1 and about 3:1 during the etch process. After the etch process, the mask layer 627 may be removed.

Figure 22:
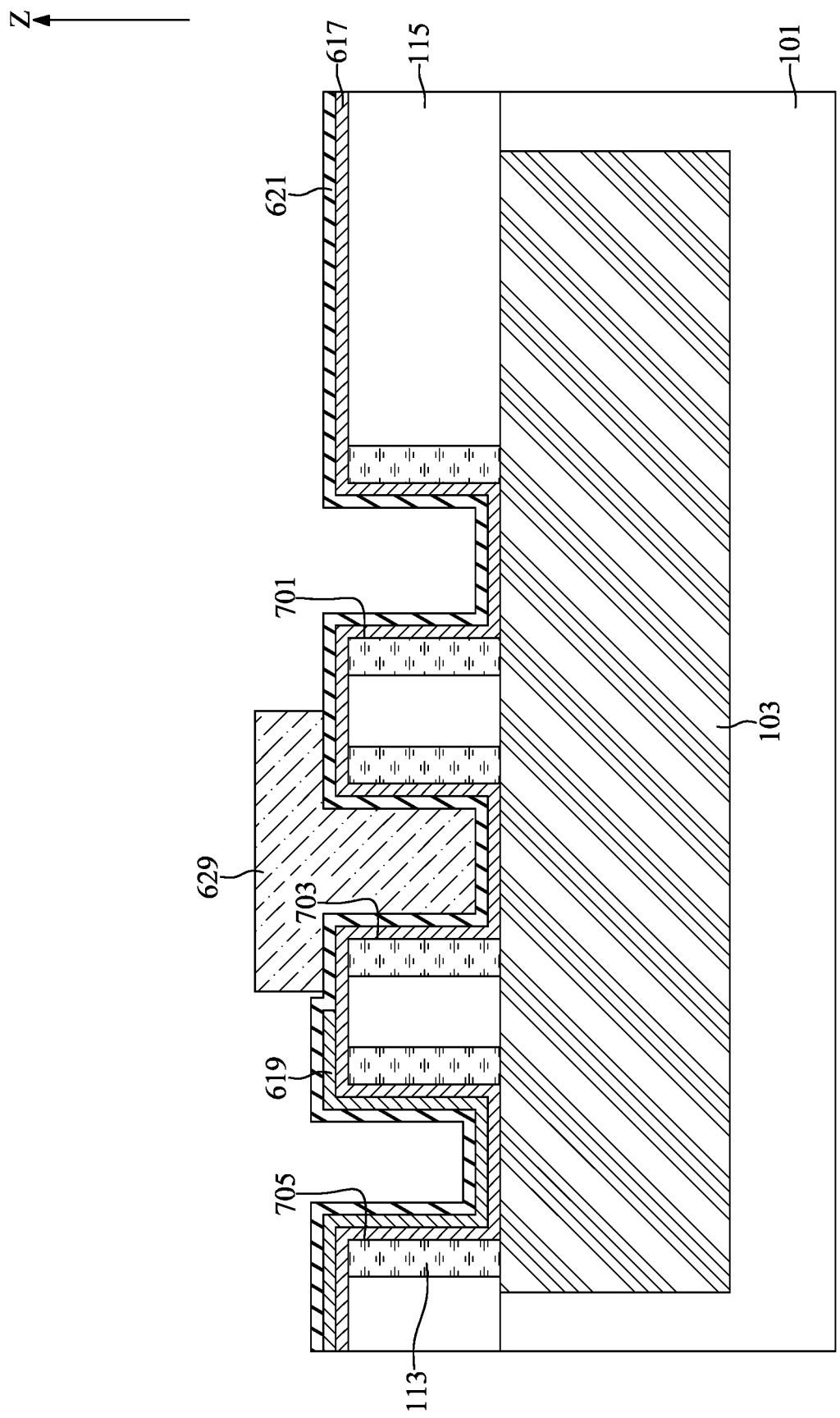

With reference to FIG. 22, a layer of second work function material 621 may be conformally formed on the layer of first work function material 619 and the layer of dielectric material 617. The second work function material 621 may be different from the first work function material 619. The second work function material 621 may be, for example, ruthenium, palladium, platinum, cobalt, nickel, and conductive metal oxides, titanium nitride, hafnium, zirconium, titanium, tantalum, aluminum, metal carbides, aluminides, or a combination thereof. A mask layer 629 may be formed on the layer of second work function material 621 to cover the second trench 703 and expose the third trench 705 and the first trench 701.

Figure 23:
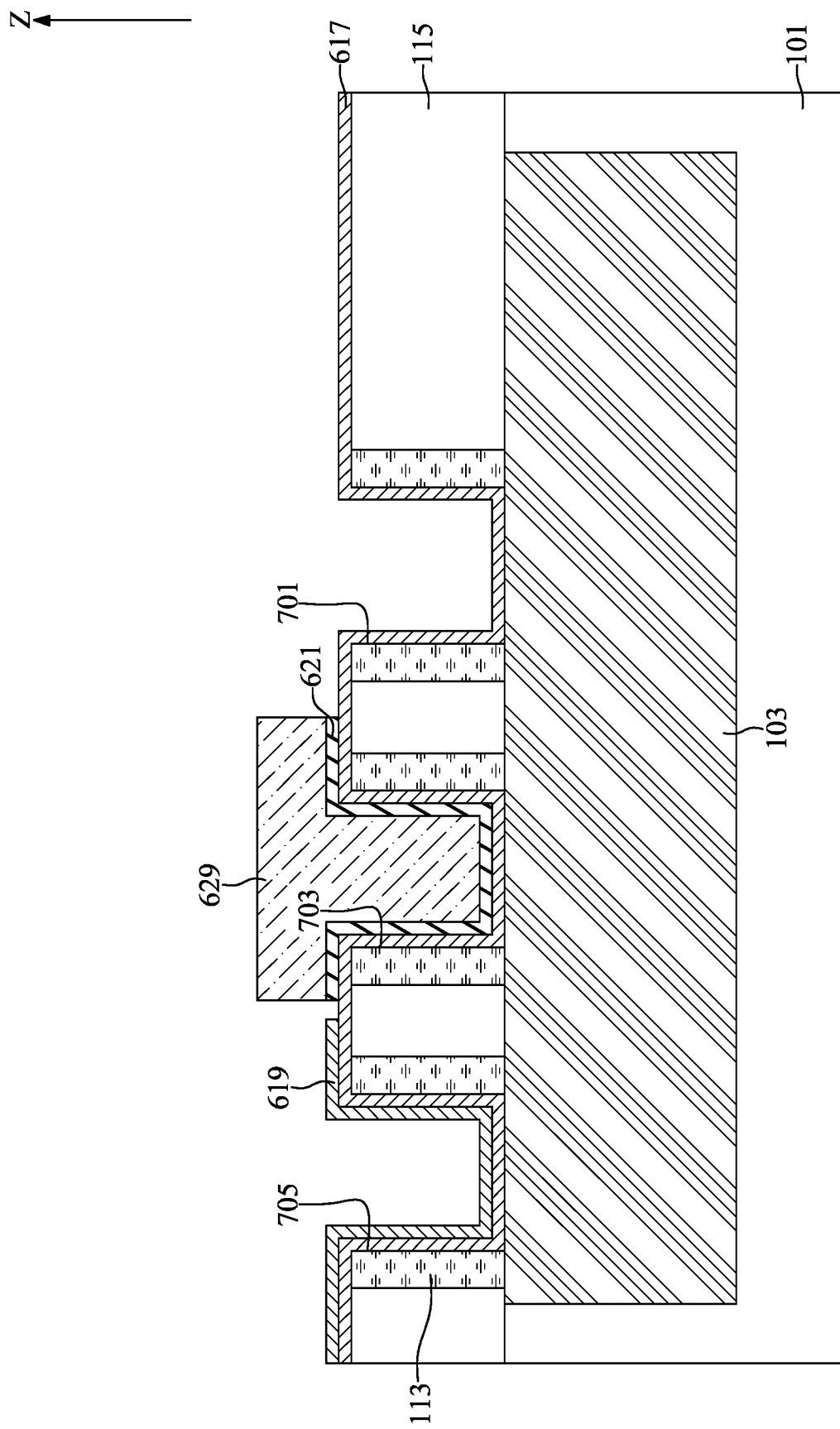

With reference to FIG. 23, an etch process may be performed to selectively remove the exposed portion of the layer of second work function material 621. The etch rate ratio of the second work function material 621 to the dielectric material 617 may be between about 15:1 and about 2:1 or between about 10:1 and about 3:1 during the etch process. The etch rate ratio of the second work function material 621 to the first work function material 619 may be between about 15:1 and about 2:1 or between about 10:1 and about 3:1 during the etch process. After the etch process, the mask layer 629 may be removed.

Figure 24:
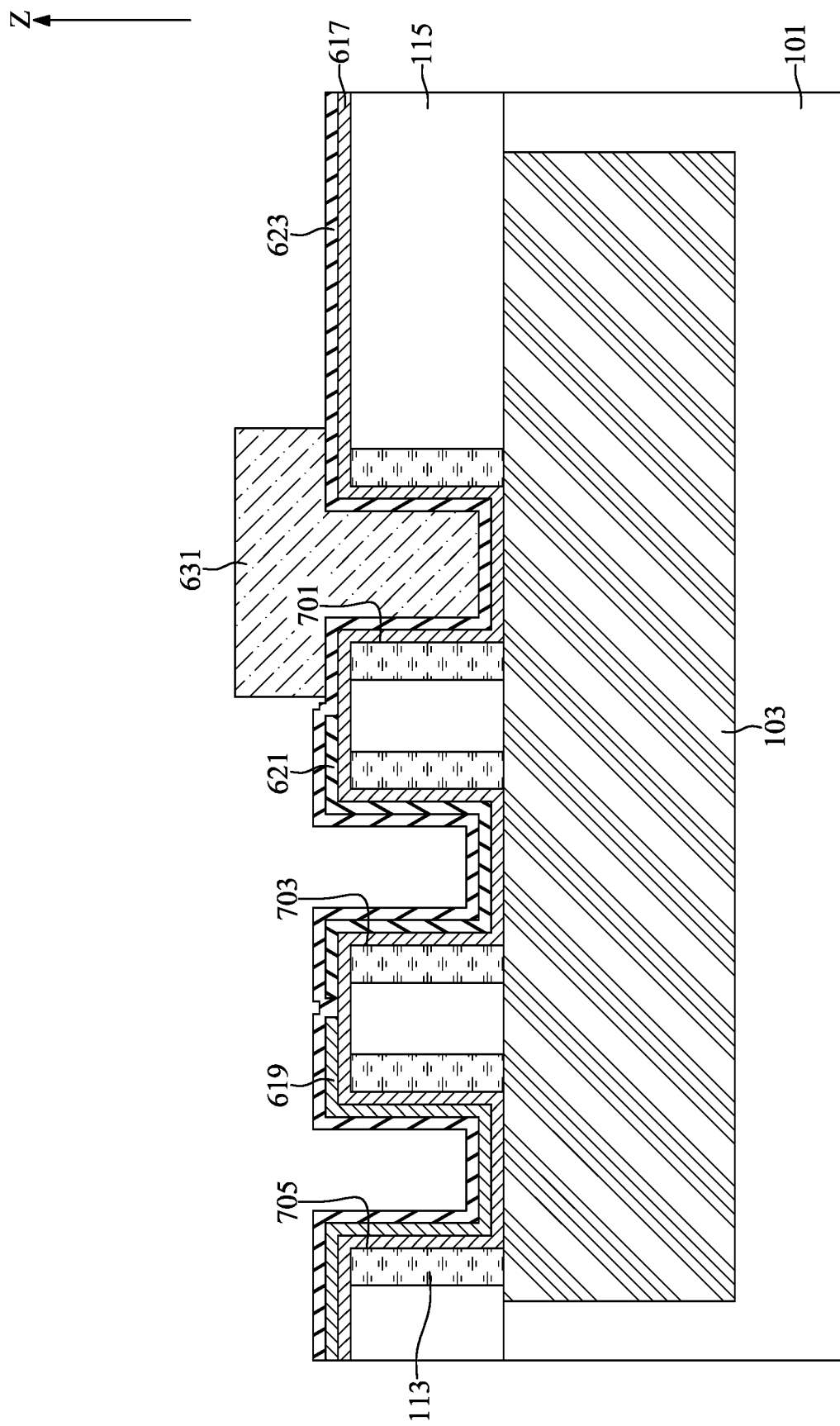

With reference to FIG. 24, a layer of third work function material 623 may be conformally formed on the layer of first work function material 619, the layer of second work function material 621, and the layer of dielectric material 617. The third work function material 623 may be different from the first work function material 619 and the second work function 621. The third work function material 623 may be, for example, ruthenium, palladium, platinum, cobalt, nickel, and conductive metal oxides, titanium nitride, hafnium, zirconium, titanium, tantalum, aluminum, metal carbides, aluminides, or a combination thereof. A mask layer 631 may be formed on the layer of third work function material 623 to cover the first trench 701 and expose the second trench 703 and the third trench 705.

Figure 25:
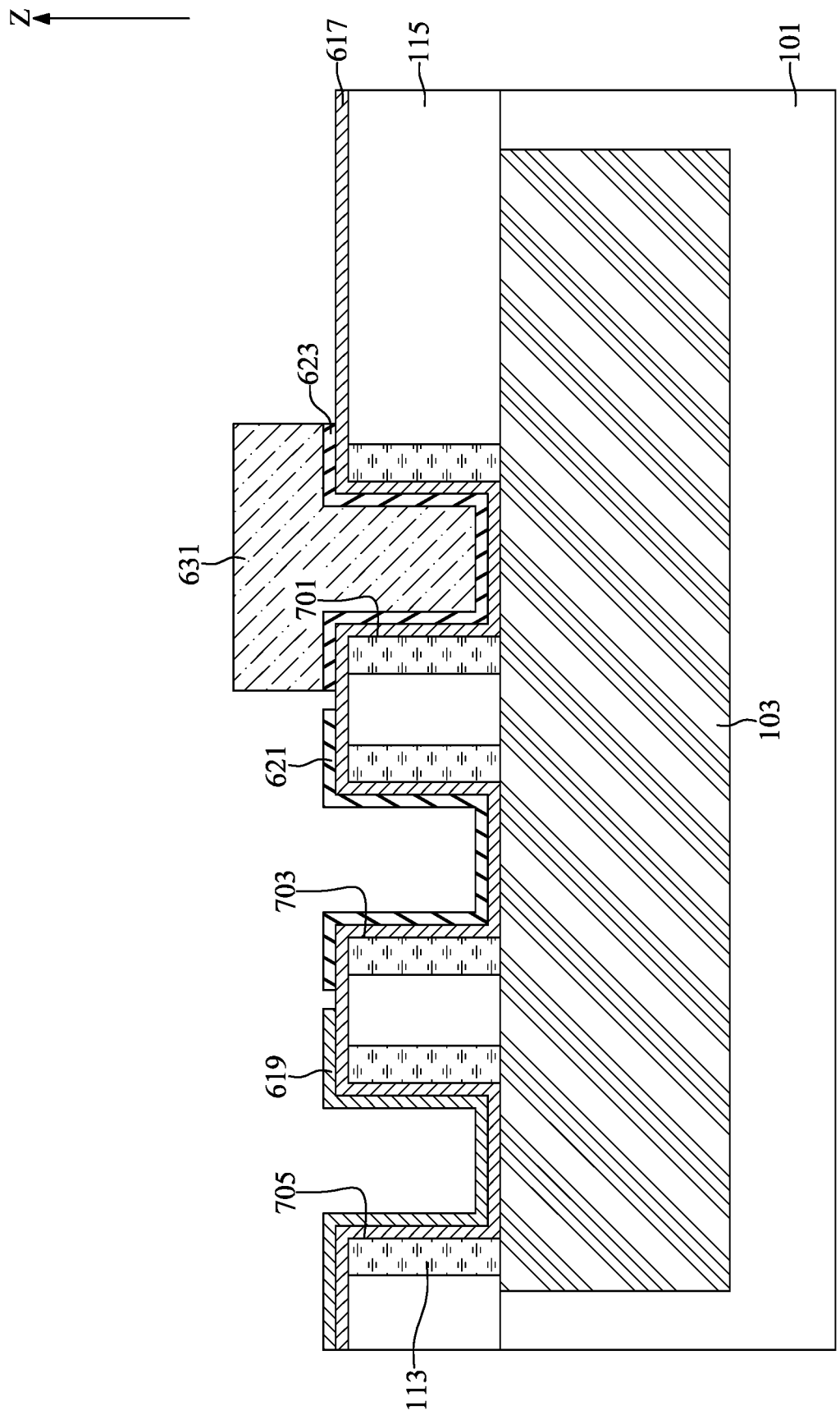

With reference to FIG. 25, an etch process may be performed to selectively remove the exposed portion of the layer of third work function material 623. The etch rate ratio of the third work function material 623 to the dielectric material 617 may be between about 15:1 and about 2:1 or between about 10:1 and about 3:1 during the etch process. The etch rate ratio of the third work function material 623 to the first work function material 619 may be between about 15:1 and about 2:1 or between about 10:1 and about 3:1 during the etch process. The etch rate ratio of the third work function material 623 to the second work function material 621 may be between about 15:1 and about 2:1 or between about 10:1 and about 3:1 during the etch process. After the etch process, the mask layer 631 may be removed.

Figure 26:
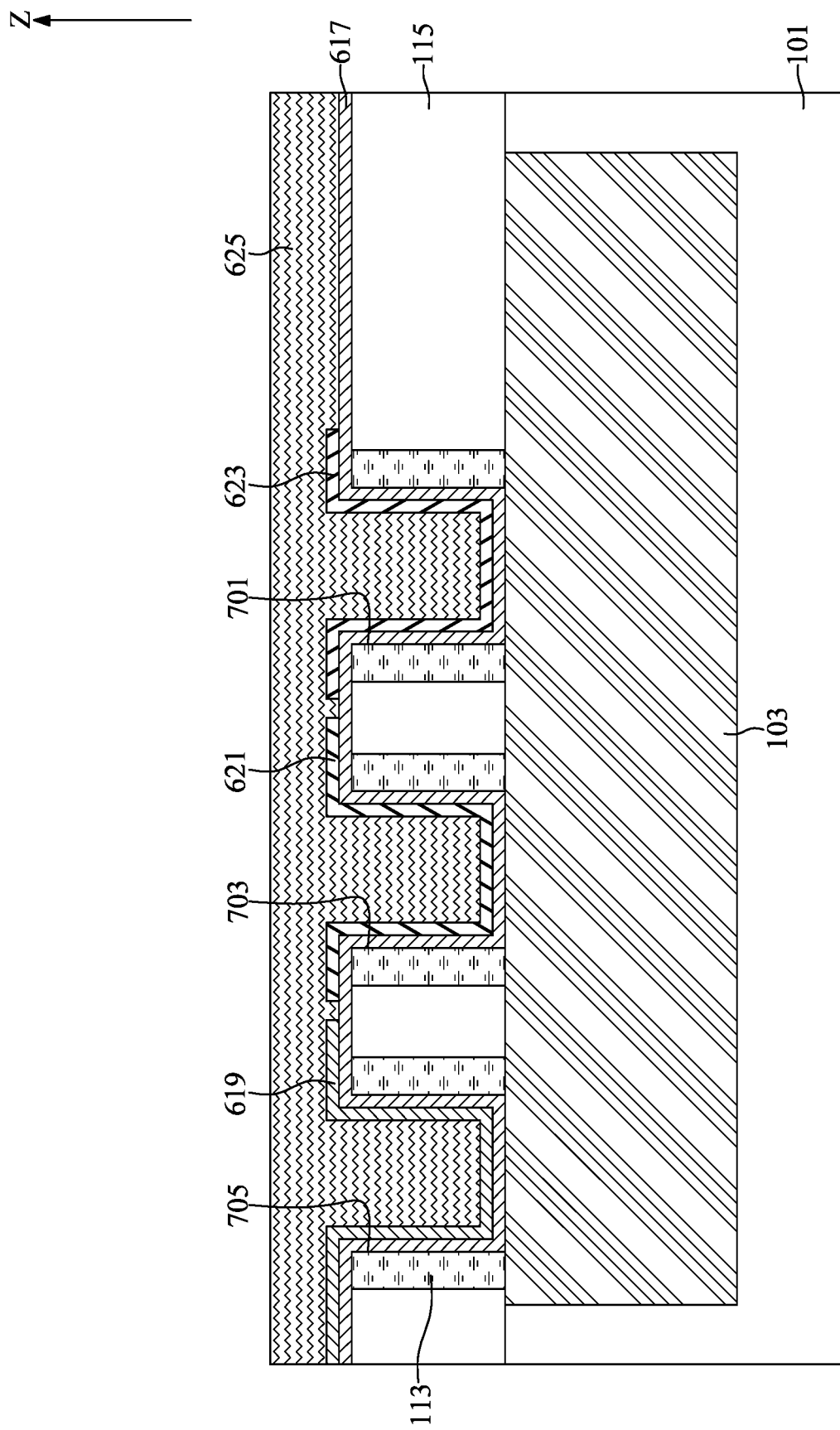

With reference to FIG. 26, a layer of filler material 625 may be formed to fill the first trench 701, the second trench 703, and the second trench 703. The filler material 625 may be, for example, tungsten, aluminum, cobalt, ruthenium, gold, silver, titanium, platinum, the like, or a combination thereof. The layer of filler material 625 may be formed by, for example, chemical vapor deposition, physical vapor deposition, plating, thermal or e-beam evaporation, the like, or a combination thereof.

Figure 27:
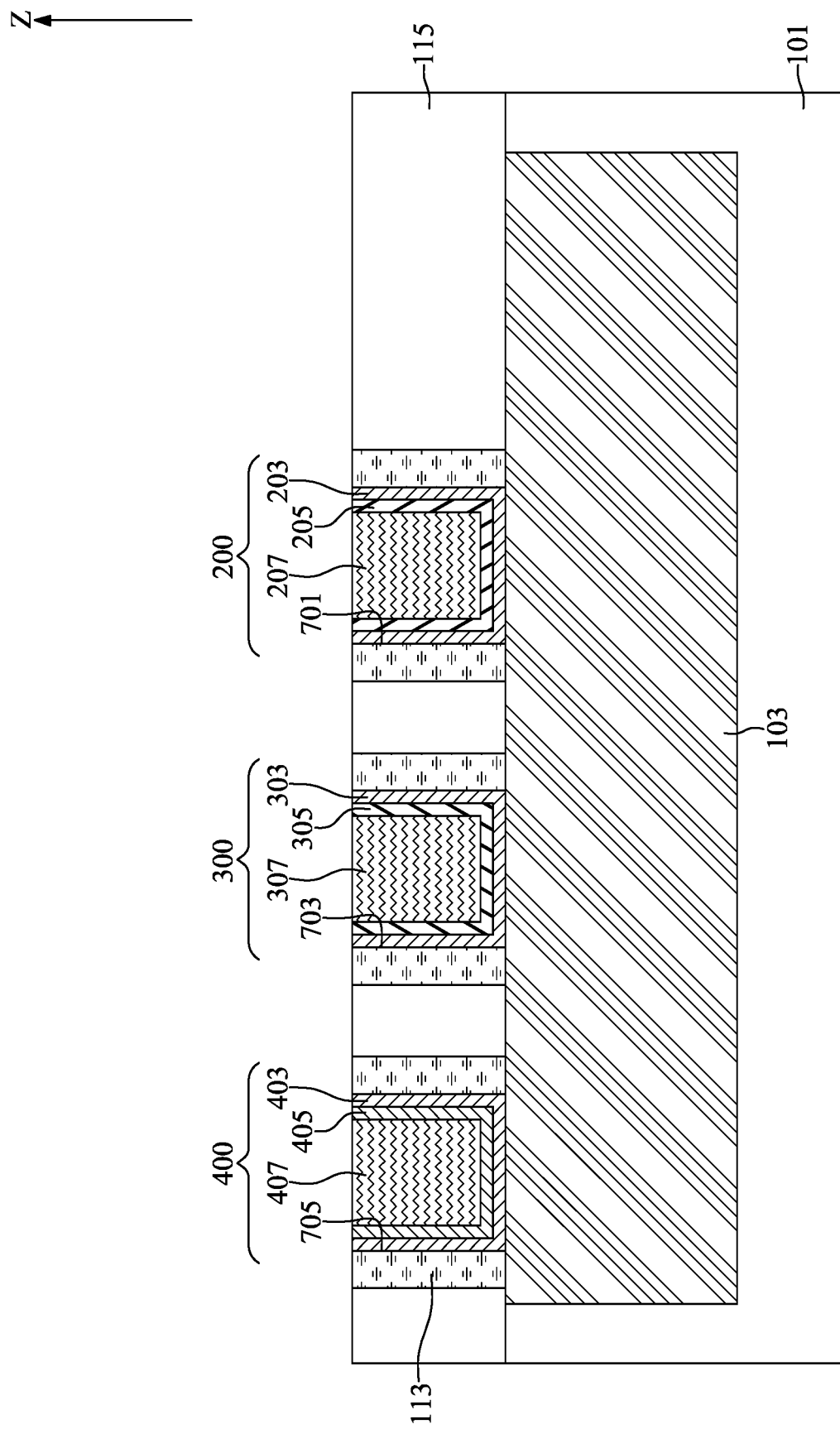

With reference to FIG. 27, a planarization process, such as chemical mechanical polishing, may be performed until the top surface of the inter-dielectric layer 115 is exposed. After the planarization process, the layer of dielectric material 617 may be turned into a first gate dielectric layer 203 in the first trench 701, a second gate dielectric layer 303 in the second trench 703, and a third gate dielectric layer 403 in the third trench 705. The layer of first work function material 619 may be turned into a third work function layer 405 in the third trench 705. The layer of second work function material 621 may be turned into a second work function layer 305 in the second trench 703. The layer of third work function material 623 may be turned into a first work function layer 205 in the first trench 701. The layer of filler material 625 may be turned into a first filler layer 207 in the first trench 701, a second filler layer 307 in the second trench 703, and a third filler layer 407 in the third trench 705. The thicknesses of the first gate dielectric layer 203, the second gate dielectric layer 303, and the third gate dielectric layer 403 may be the same.

With reference to FIG. 27, the first gate dielectric layer 203, the first work function layer 205, the second gate dielectric layer 303, the second work function layer 305, the third gate dielectric layer 403, and the third work function layer 405 may have U-shaped cross-sectional profiles.

With reference to FIG. 27, the first gate dielectric layer 203, the first work function layer 205, and the first filler layer 207 together configure the first gate structure 200. The second gate dielectric layer 303, the second work function layer 305, and the second filler layer 307 together configure the second gate structure 300. The third gate dielectric layer 403, the third work function layer 405, and the third filler layer 407 together configure the third gate structure 400. In some embodiments, the fabrication of the first gate structure 200, the second gate structure 300, and the third gate structure 400 may be easily integrated with gates of logic elements With reference to FIGS. 14 and 28, at Step S29, a conductive plug 107 may be formed to electrically couple to the bottom conductive layer 103 and a top conductive layer 111 may be formed to electrically couple to the first gate structure 200, the second gate structure 300, and the third gate structure 400.

Figure 28:
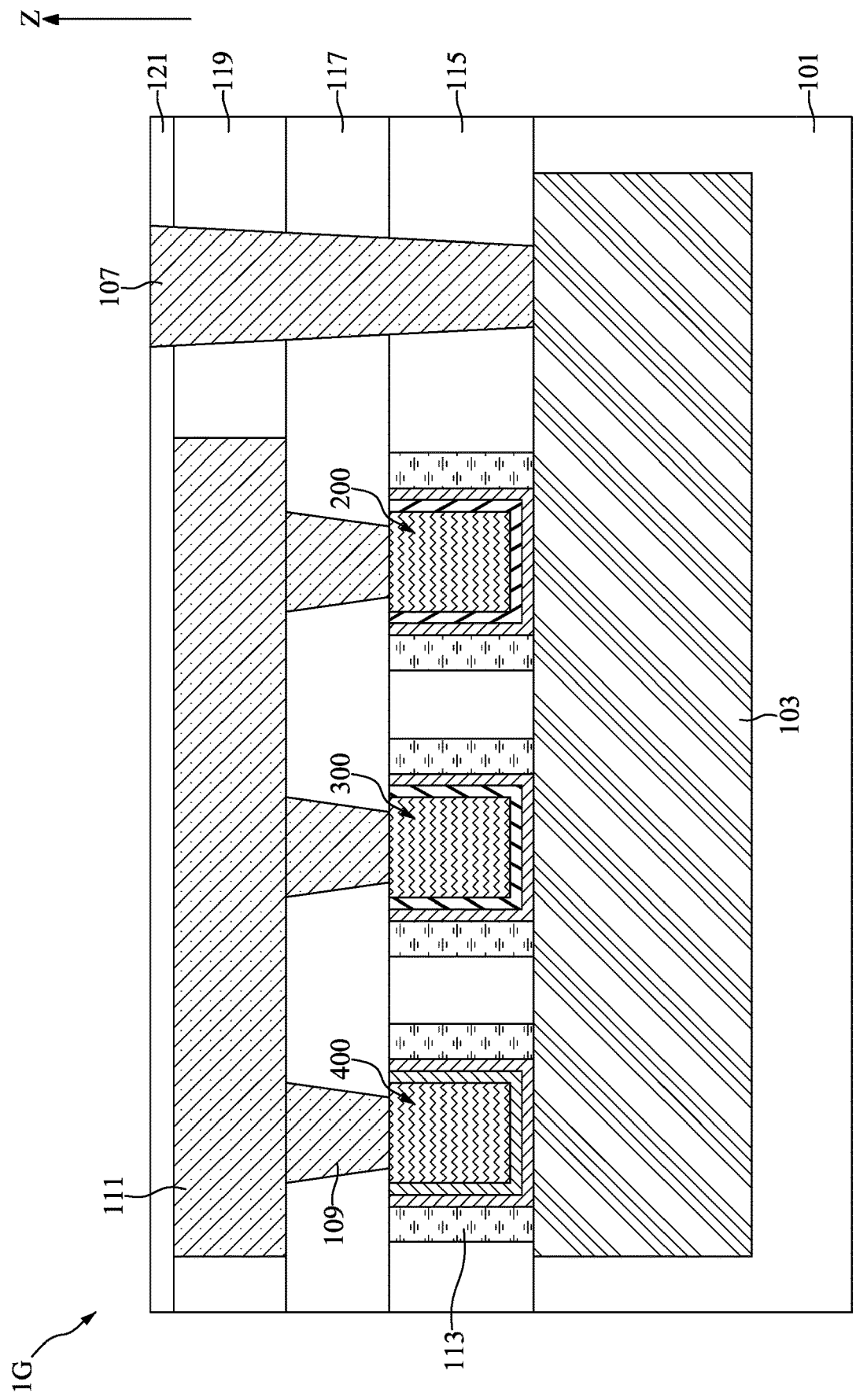

With reference to FIG. 28, inter-dielectric layers 117 may be formed on the inter-dielectric layer 115 and inter-dielectric layers 119 may be formed on the inter-dielectric layer 117. The conductive vias 109 and the top conductive layer 111 may be formed in the inter-dielectric layer 117 and the inter-dielectric layer 119 by, for example, a damascene process. The top conductive layer 111 may be electrically coupled to the first gate structure 200, the second gate structure 300, and the third gate structure 400 through the conductive vias 109. The inter-dielectric layer 121 may be formed on the inter-dielectric layer 119. The conductive plug 107 may be formed along the inter-dielectric layers 115, 117, 119, 121 and on the bottom conductive layer 103.

As the first work function layer 205, the second work function layer 305, and the third work function layer 405 are formed of different work function material, the first gate structure 200, the second gate structure 300, and the third gate structure 400 have different work functions. Accordingly, different programming voltages may be needed to program the first gate structure 200, the second gate structure 300, or the third gate structure 400.

Figure 29:
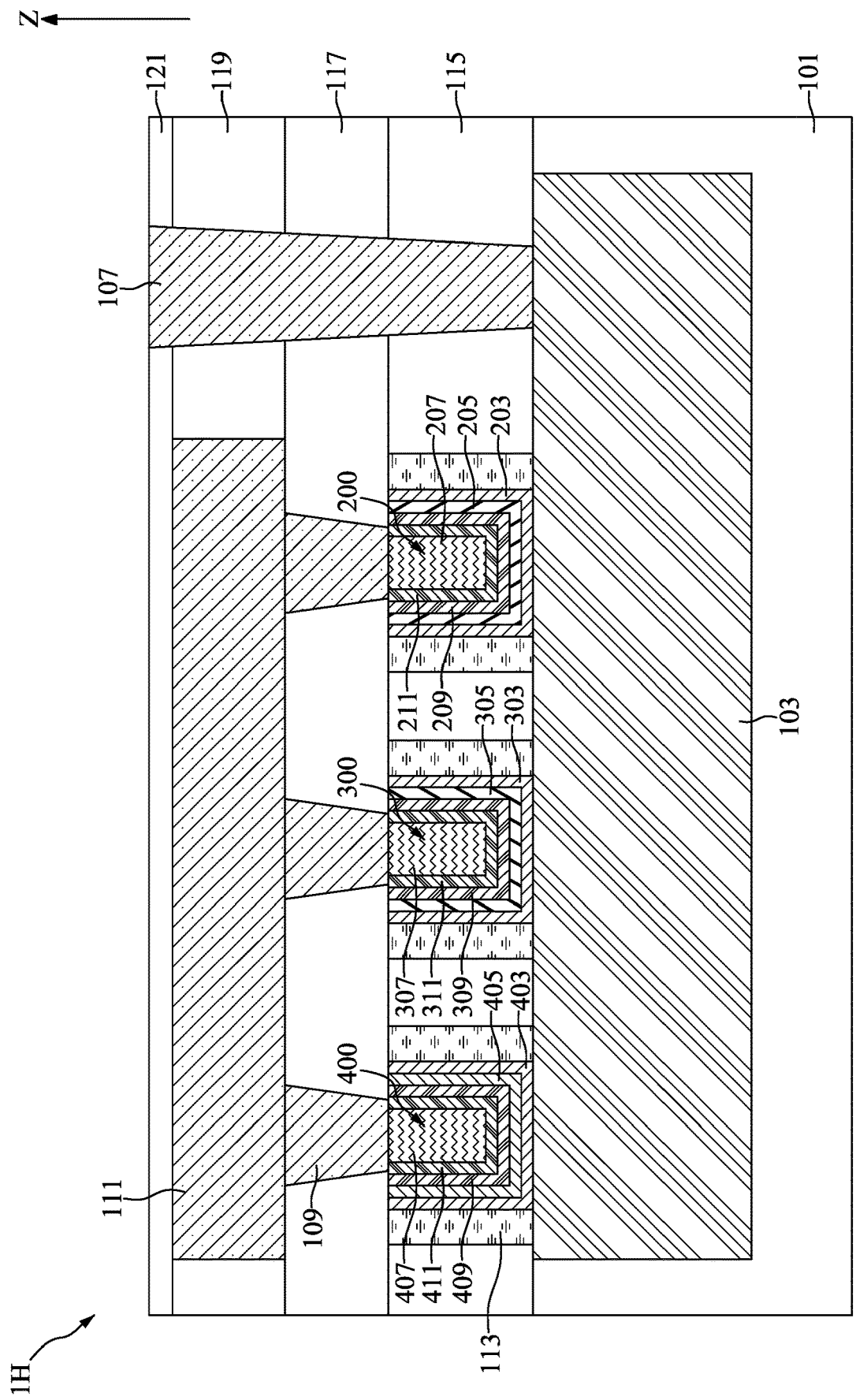
FIGS. 29 and 30 illustrate, in schematic cross-sectional view diagrams, semiconductor devices 1H and 1I in accordance with some embodiments of the present disclosure.
Figure 30:
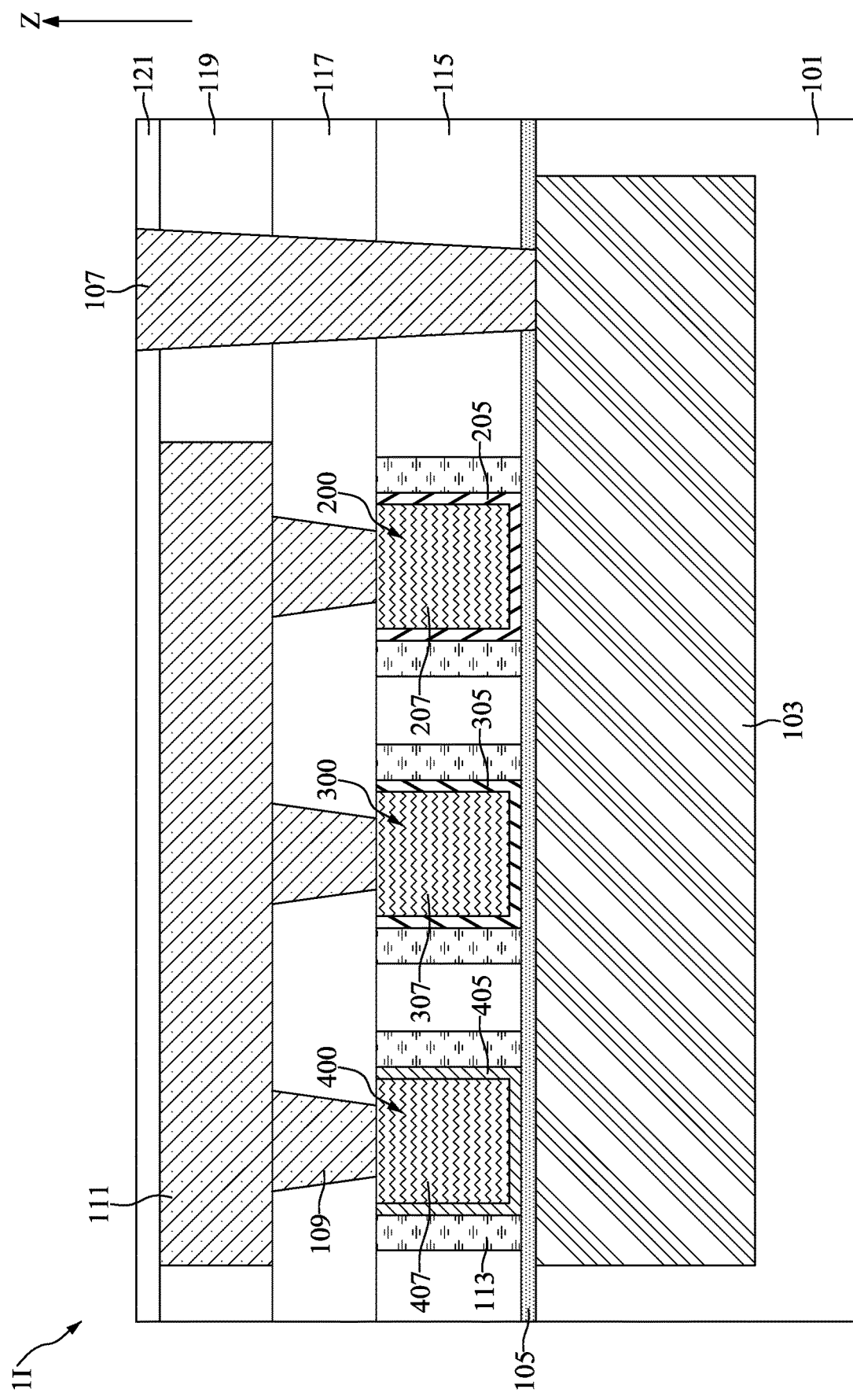

FIGS. 29 and 30 illustrate, in schematic cross-sectional view diagrams, semiconductor devices 1H and 1I in accordance with some embodiments of the present disclosure.

With reference to FIG. 29, the semiconductor device 1H may have a structure similar to that illustrated in FIG. 28. The same or similar elements in FIG. 29 as in FIG. 28 have been marked with similar reference numbers and duplicative descriptions have been omitted. The first gate structure 200 may further include first wetting layer 209 and first barrier layer 211. The second gate structure 300 may further include second wetting layer 309 and second barrier layer 311. The third gate structure 400 may further include third wetting layer 409 and third barrier layer 411.

The first wetting layer 209 may be disposed between the first work function layer 205 and the first filler layer 207. The second wetting layer 309 may be disposed between the second work function layer 305 and the second filler layer 307. The third wetting layer 409 may be disposed between the third work function layer 405 and the third filler layer 407. The first wetting layer 209, the second wetting layer 309, and the third wetting layer 409 may be formed of, for example, titanium, tantalum, nickel, or cobalt. The first wetting layer 209, the second wetting layer 309, and the third wetting layer 409 may promote bonding between the layers and may promote uniform deposition of the subsequent layers.

The first barrier layer 211 may be disposed between the first wetting layer 209 and the first filler layer 207. The second barrier layer 311 may be disposed in the second wetting layer 309 and the second filler layer 307. The third barrier layer 411 may be disposed between the third wetting layer 409 and the third filler layer 407. The first barrier layer 211, the second barrier layer 311, and the third barrier layer 411 may be formed of, for example, titanium nitride, tantalum nitride, or a combination thereof. The first barrier layer 211, the second barrier layer 311, and the third barrier layer 411 may prevent subsequent deposition processes from degrading other layers of the semiconductor device 1H.

With reference to FIG. 30, the semiconductor device 1I may have a structure similar to that illustrated in FIG. 28. The same or similar elements in FIG. 30 as in FIG. 28 have been marked with similar reference numbers and duplicative descriptions have been omitted.

With reference to FIG. 30, the substrate 101, the bottom conductive layer 103, and the insulation layer 105 may be formed with a procedure similar to that illustrated in FIGS. 2 and 3. The inter-dielectric layer 115 and the spacers 113 may be formed with a procedure similar to that illustrated in FIGS. 15 to 18. The first work function layer 205, the first filler layer 207, the second work function layer 305, the second filler layer 307, the third work function layer 405, the third filler layer 407, the conductive plug 107, the conductive vias 109, the top conductive layer 111, and the inter-dielectric layers 117, 119, 121 may be formed with a procedure similar to that illustrated in FIGS. 20 to 28.

With reference to FIG. 30, the first work function layer 205 and the first filler layer 207 together configure the first gate structure 200. The second work function layer 305 and the second filler layer 307 together configure the second gate structure 300. The third work function layer 405 and the third filler layer 407 together configure the third gate structure 400. As the first work function layer 205, the second work function layer 305, and the third work function layer 405 are formed of different work function material, the first gate structure 200, the second gate structure 300, and the third gate structure 400 have different work functions. Accordingly, different programming voltages may be needed to program the first gate structure 200, the second gate structure 300, or the third gate structure 400.

Due to the design of the semiconductor device 1A of the present disclosure, the resistance of the programmable unit after a programming procedure can be fine-tuned by controlling the programming voltage applied. In addition, various of programming voltages (e.g., −4.5 volts to +4.5 volts) can be selected and applied to program the programmable unit. In other words, the programmable unit can be operated with various voltages in an integrated circuit according to design demand. Furthermore, the programmable unit can be programmed by a relatively smaller (or shallower) voltage (e.g., −2.5 volts or +2.5 volts). That is, the surface area for a charge-pump circuit, which is used to generate the programming voltage, can be reduced. As a result, more surface area can be provided for other functional elements such as logic function elements.

Although the present disclosure and its advantages have been described in detail, it should be understood that various changes, substitutions, and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:
1. A semiconductor device, comprising:
a substrate;
a bottom conductive layer positioned in the substrate;
a first gate structure comprising a first gate dielectric layer positioned on and in direct contact with the bottom conductive layer, a first work function layer positioned on and in contact with the first gate dielectric layer, and a first filler layer positioned on the first work function layer, wherein the first work function layer has a first work function;
a second gate structure comprising a second gate dielectric layer positioned on and in direct contact with the bottom conductive layer and spaced apart from the first gate dielectric layer, a second work function layer positioned on and in contact with the second gate dielectric layer, and a second filler layer positioned on the second work function layer, wherein the second work function layer has a second work function different from the first work function;
a conductive plug electrically coupled to the bottom conductive layer;
a top conductive layer electrically coupled to the first gate structure and the second gate structure;
a first wetting layer positioned between the first work function layer and the first filler layer, wherein the first wetting layer is in direct contact with the first work function layer and is spaced apart from the first filler layer in a contact-less manner;
a second wetting layer positioned between the second work function layer and the second filler layer, wherein the second wetting layer is in direct contact with the second work function layer and is spaced apart from the second filler layer in a contact-less manner, wherein the first and second wetting layers are configured to promote bonding between layers and to promote uniform deposition of the layers;
a first barrier layer positioned between and in contact with the first wetting layer and the first filler layer, wherein the first wetting layer is in direct contact between the first work function layer and the first barrier layer; and
a second barrier layer positioned between and in contact with the second wetting layer and the second filler layer, wherein the second wetting layer is in direct contact between the second function layer and the second barrier layer, wherein the first and second barrier layers are configured to prevent subsequent deposition processes from layers degrading;
wherein the first barrier layer and the second barrier layer have U-shaped cross-sectional profiles, such that the first filler layer and the second filler layer are disposed in and in direct contact with the first barrier layer and the second barrier layer respectively;

wherein the bottom conductive layer, the first gate structure, and the second gate structure together configure a programmable unit.

2. The semiconductor device of claim 1, wherein the first gate dielectric layer and the second gate dielectric layer have a same thickness.

3. The semiconductor device of claim 2, further comprising spacers positioned on two sides of the first gate structure and on two sides of the second gate structure.

4. The semiconductor device of claim 3, wherein the first wetting layer is formed of tantalum, nickel, or cobalt.

5. The semiconductor device of claim 4, wherein the first barrier layer is formed of tantalum nitride.

6. The semiconductor device of claim 1, wherein the first gate dielectric layer and the second gate dielectric layer, the first work function layer and the second work function layer, and the first wetting layer and the second wetting layer have U-shaped cross-sectional profiles.

7. The semiconductor device of claim 1, wherein the bottom conductive layer is formed of doped silicon, doped germanium, doped silicon germanium, or a combination thereof, wherein the bottom conductive layer is made of material different from a material of the substrate.

8. The semiconductor device of claim 1, wherein the bottom conductive layer is formed of tungsten, aluminum, titanium, copper, or a combination thereof, wherein the bottom conductive layer is made of material different from a material of the substrate.

* * * * *